United States Patent [19]

Nakayama et al.

[11] Patent Number: 4,924,131
[45] Date of Patent: May 8, 1990

[54] PIEZO-ELECTRIC ACCELERATION SENSOR

[75] Inventors: Shiro Nakayama; Satoshi Kunimura; Shigemi Takahashi; Katsuhiko Takahashi; Toshimitu Hirayama; Masao Akutsu, all of Tokyo, Japan

[73] Assignee: Fujikura Ltd., Tokyo, Japan

[21] Appl. No.: 257,346

[22] Filed: Oct. 13, 1988

[30] Foreign Application Priority Data

| Oct. 14, 1987 | [JP] | Japan | 62-258780 |
| Dec. 28, 1987 | [JP] | Japan | 62-332418 |
| Jan. 29, 1988 | [JP] | Japan | 63-18588 |
| Apr. 22, 1988 | [JP] | Japan | 63-54144[U] |
| Jun. 20, 1988 | [JP] | Japan | 63-151390 |
| Jun. 20, 1988 | [JP] | Japan | 63-151389 |
| Jun. 20, 1988 | [JP] | Japan | 63-151388 |
| Jun. 27, 1988 | [JP] | Japan | 63-158335 |
| Jun. 27, 1988 | [JP] | Japan | 63-158334 |
| Jun. 27, 1988 | [JP] | Japan | 63-158333 |
| Aug. 15, 1988 | [JP] | Japan | 63-202906 |
| Aug. 15, 1988 | [JP] | Japan | 63-202908 |
| Aug. 15, 1988 | [JP] | Japan | 63-202904 |
| Aug. 15, 1988 | [JP] | Japan | 63-202905 |
| Aug. 15, 1988 | [JP] | Japan | 63-202910 |
| Aug. 15, 1988 | [JP] | Japan | 63-202903 |
| Aug. 15, 1988 | [JP] | Japan | 63-202902 |
| Aug. 15, 1988 | [JP] | Japan | 63-202901 |
| Aug. 15, 1988 | [JP] | Japan | 63-202909 |
| Aug. 15, 1988 | [JP] | Japan | 63-202911 |
| Aug. 15, 1988 | [JP] | Japan | 63-202907 |

[51] Int. Cl.$^5$ .......................... H01L 41/08
[52] U.S. Cl. .................. 310/329; 310/800; 73/516 R; 73/517 R
[58] Field of Search ........... 310/328, 329, 330–332, 310/800; 73/516 R, 517 R, DIG. 4, 35

[56] References Cited

U.S. PATENT DOCUMENTS

| 3,858,065 | 12/1974 | Epstein | 310/329 |
| 4,048,526 | 9/1977 | Taylor | 310/800 X |
| 4,051,395 | 9/1977 | Taylor | 310/800 X |
| 4,315,433 | 2/1982 | Edelman et al. | 310/329 X |
| 4,413,202 | 11/1983 | Krempl et al. | 310/800 X |
| 4,653,036 | 3/1987 | Harris et al. | 310/800 X |
| 4,658,650 | 4/1987 | Yorinaga et al. | 310/329 X |
| 4,660,410 | 4/1987 | Asano et al. | 310/329 X |
| 4,734,611 | 3/1988 | Granz | 310/800 X |
| 4,782,469 | 11/1988 | Granz et al. | 310/800 X |

FOREIGN PATENT DOCUMENTS 61-96340 6/1986 Japan .
61-99026 6/1986 Japan .

Primary Examiner—Mark O. Budd
Attorney, Agent, or Firm—Frishauf, Holtz, Goodman & Woodward

[57] ABSTRACT

A piezo-electric acceleration sensor, including: a piezo-electric polymer membrane element having an element through-hole; a diaphragm having a diaphragm through-hole and attached to the piezo-electric membrane element so that the diaphragm hole is concentric to the element through-hole to form a laminate with a laminate through-hole; and a fixing mechanism, having a sensing hole, for fixing the laminate in a stretched manner, and wherein: the laminate through-hole has about 2.25 to about 80% of the area of the sensing hole; and the diaphragm and the piezo-electric element meet the equation:

$$(E_b \times T_b^3)/(E_p \times T_{p3}) \geqq \text{about } 5$$

wherein Eb, Tb, Ep and Tp are Young's modulus thickness of the diaphragm, Young's modulus, and thickness of the piezo-electric element, respectively, whereby acceleration, applied to the diaphragm, is detected based on a quantity of electricity generated due to strains in a piezo-electric element.

5 Claims, 31 Drawing Sheets

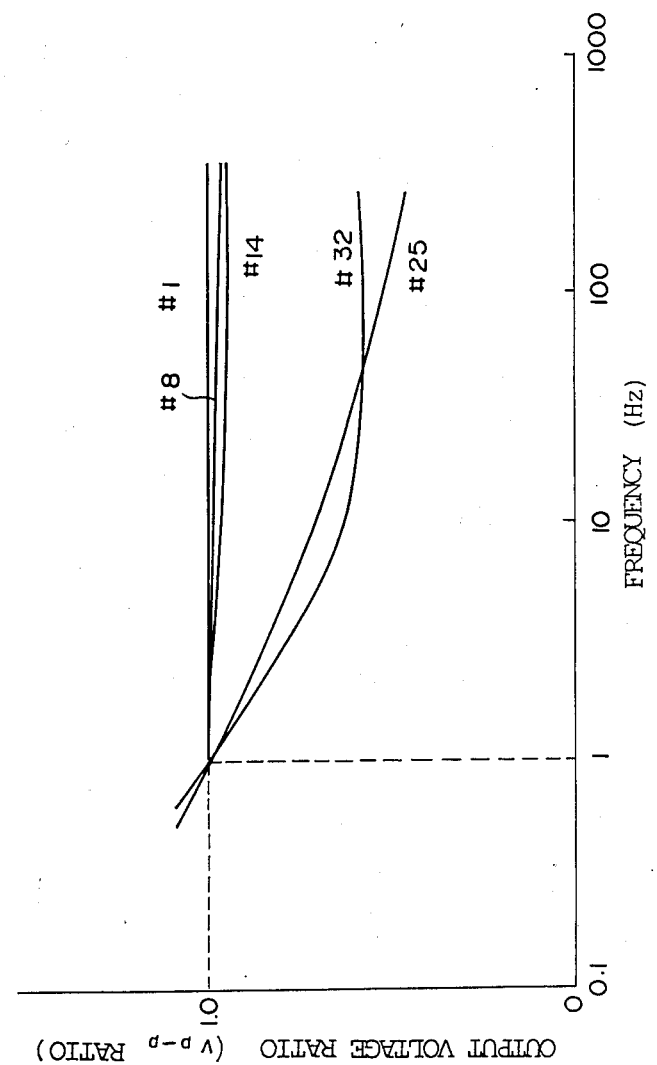

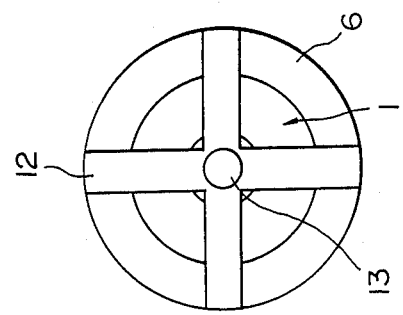
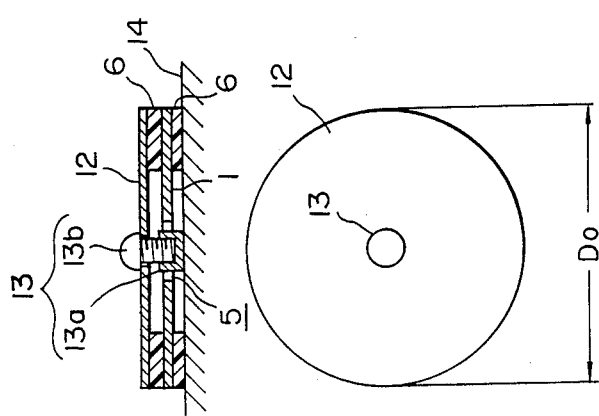

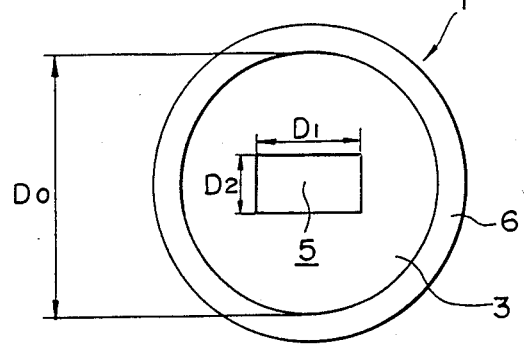
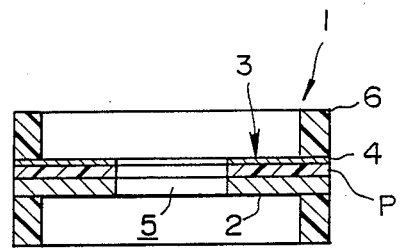
FIG.20(A) FIG.20(B)
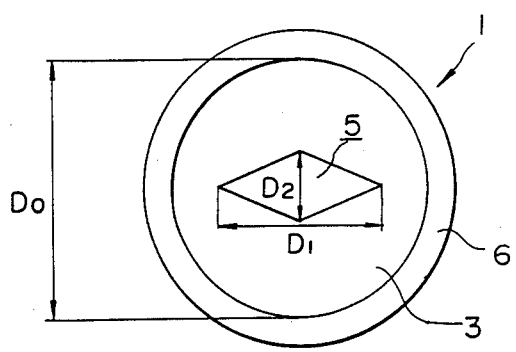
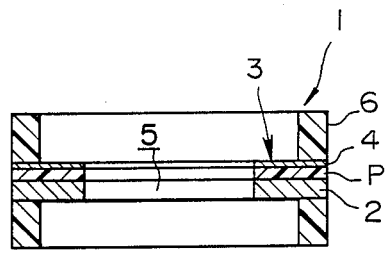
FIG.21(A) FIG.21(B)

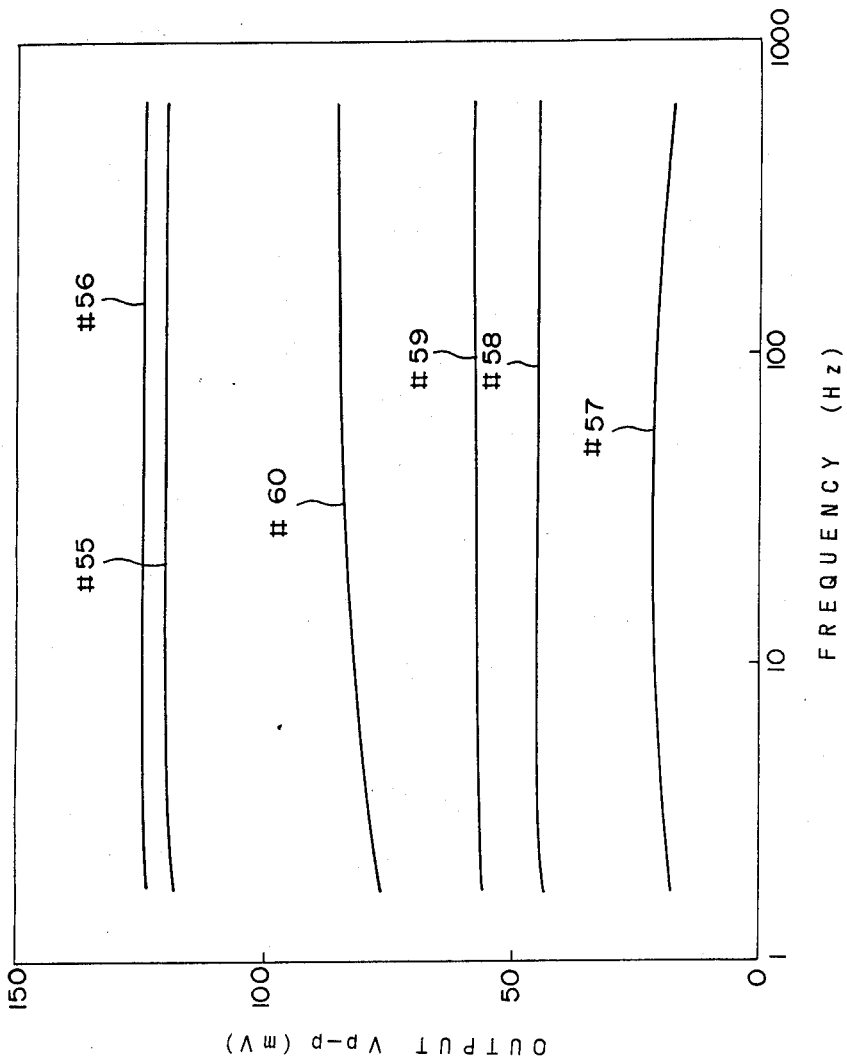

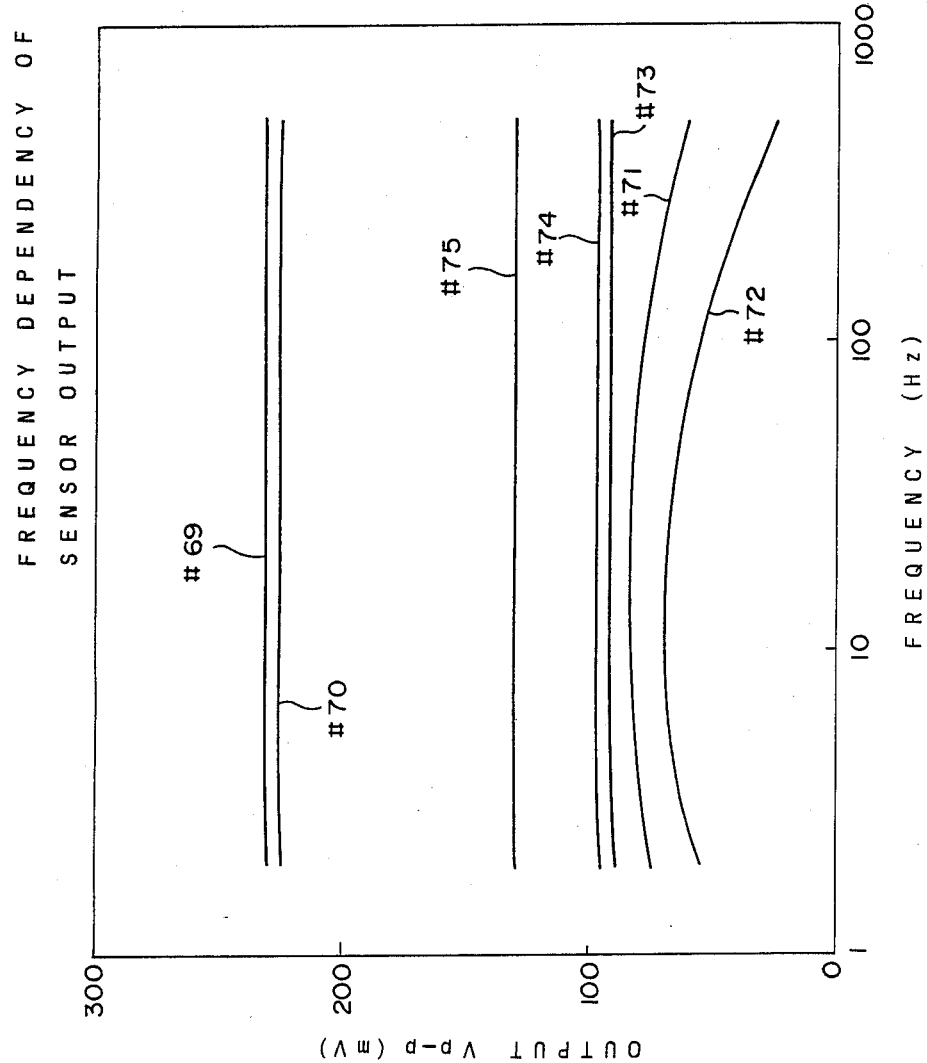

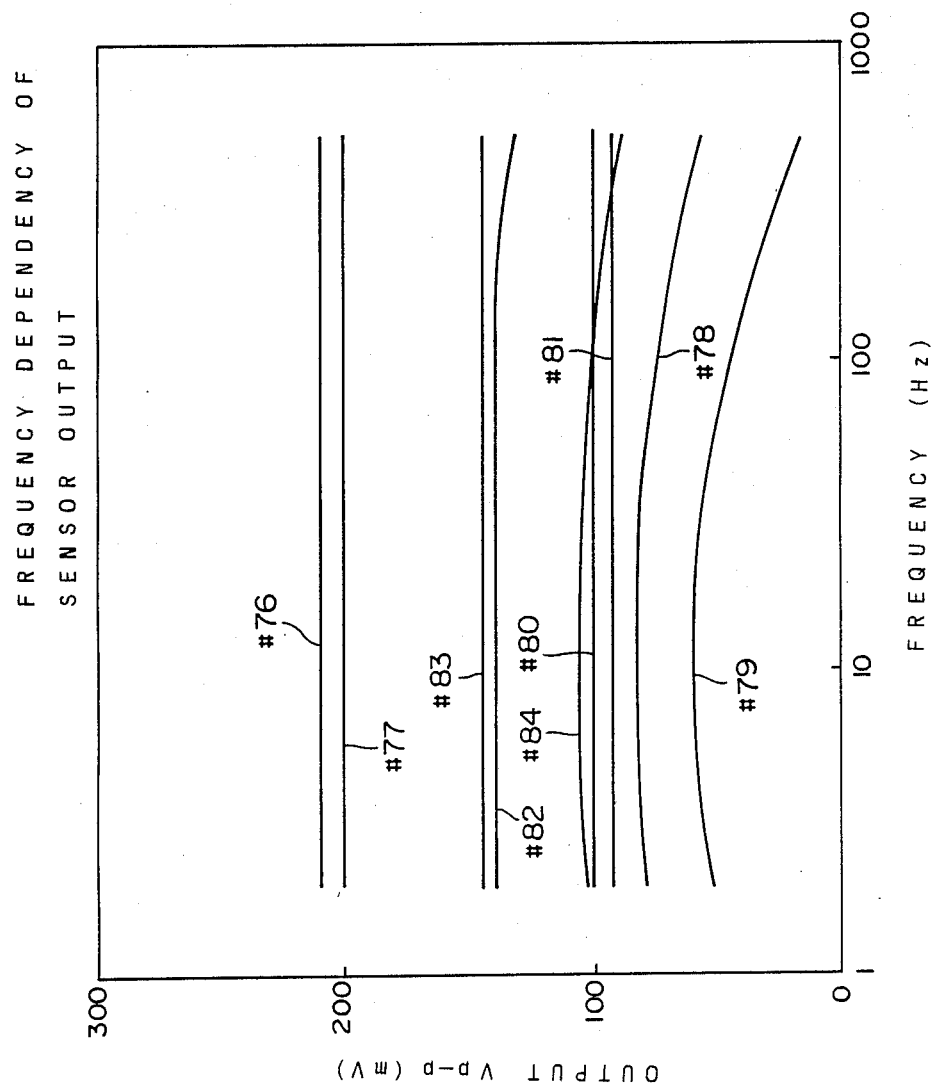

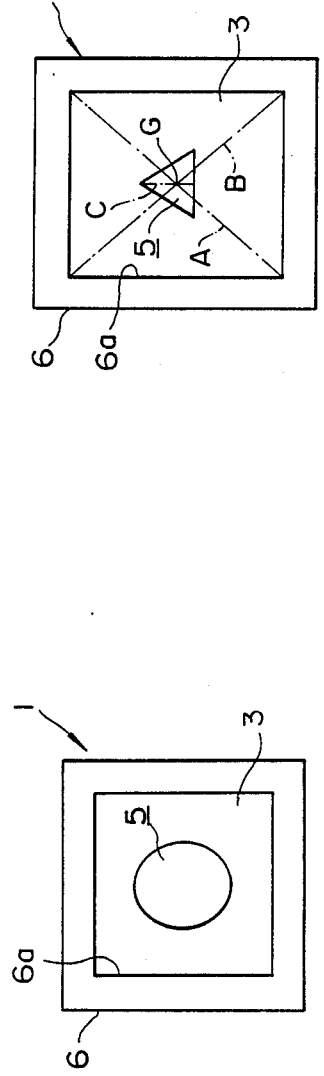
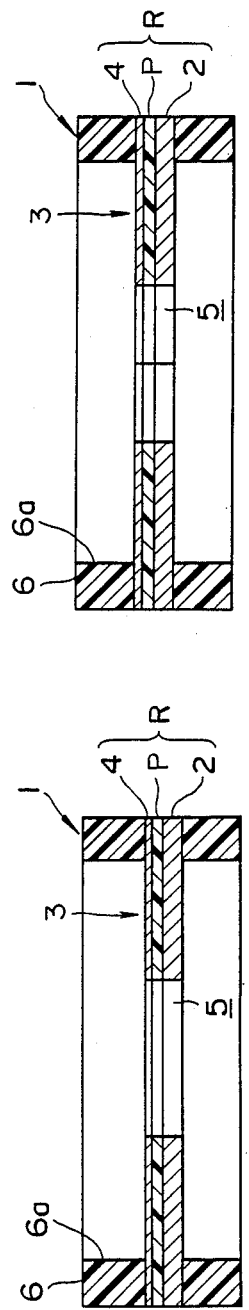

PIEZO-ELECTRIC ACCELERATION SENSOR

BACKGROUND OF THE INVENTION

The present invention relates to a piezo-electric acceleration sensor for detecting acceleration of a diaphragm by means of a polymer piezo-electric element.

One typical example of the conventional piezoelectric acceleration sensor, using a polymer piezo-electric element, has a cantilever structure, in which a piezoelectric device P including the polymer piezo-electric element is supported by a supporting member S in a cantilever fashion as illustrated in FIG. 48(A). When a force F is applied to a weight M, mounted to the distal end of the piezo-electric device, strain is produced perpendicularly to the polarization axis. This piezo-electric acceleration sensor is disadvantageous in that when the polymer piezo-electric material is used as a diaphragm, resonance frequency becomes lower and the frequency of oscillation acceleration varies, thus varying the output of the sensor.

For improving the cantilever type piezo-electric acceleration sensor, an oscillation membrane of a film type sensor is proposed in Japanese Utility Model Application (kokai) No. 61-96340, in which a disc membrane piezo-electric element P and a diaphragm are sandwiched between ring-shaped fixing frames S in a laminated state. In this film-type sensor, overall oscillation characteristics may be improved by making the rigidity or deformation rigidity of the diaphragm sufficiently large relative to that of the polymer piezo-electric element P to thereby improve resonance frequency characteristics and to increase its output without deteriorating piezo-electricity of the piezo-electric element P. However, this type of sensor is insufficient in frequency characteristics and accuracy of acceleration detection in a low frequency range at low acceleration.

Japanese Utility Model Application (kokai) No. 61-99026 discloses a diaphragm membrane having a V-shaped flexible portion formed in a central portion thereof in a cantilever manner for improving thickness-wise oscillation detection characteristics. In this sensor, oscillation characteristics are considerably influenced by the V-shaped flexible portion, and hence it is liable to have the disadvantages of the cantilever-type sensor previously stated and it is likely that detection of oscillation frequency and amplitude in a wide range and detection of acceleration in a large temperature change environment become unstable.

Accordingly, it is an object of the present invention to provide a polymer piezo-electric acceleration sensor which provides stable output characteristics and frequency characteristics particularly at low acceleration and in a low frequency range.

It is another object of the present invention to provide a piezo-electric acceleration sensor which provides high sensitivity and high output.

SUMMARY OF THE INVENTION

With these and other objects in view, the present invention provides a piezo-electric acceleration sensor, including: a piezo-electric polymer membrane element having and element through-hole; a diaphragm having a diaphragm through-hole and attached to the piezo-electric membrane element so that the diaphragm hole is concentric to the element through-hole to form a laminate with a laminate through-hole; and a fixing mechanism, having a sensing hole, for fixing the laminate in a stretched manner, and wherein: the laminate through-hole has about 2.25 to about 80% of the area of the sensing hole; and the properties of the diaphragm and the piezo-electric element meet the equation:

$$(E_b \times T_b^3)/(E_p \times T_p^3) \geq 5$$

where $E_b$, $T_b$, $E_p$ and $T_p$ are Young's modulus, the diaphragm, Young's modulus, and thickness of the piezo-electric element, respectively, whereby acceleration, applied to the diaphragm, is detected based on a quantity of electricity generated due to strains in a piezo-electric element.

BRIEF DESCRIPTION OF THE DRAWINGS

In the drawings:

FIG. 7 is a graph showing frequency characteristics of each sensor;

FIG. 15 is a plan view of a ninth embodiment of the present invention;

FIGS. 16 (A) and (B) are an axial cross-sectional view and a plan view of a tenth embodiment of the present invention;

FIG. 19 (B) is a plan view of the sensor of FIG. 19 (A);

FIGS. 20 (A) and 20 (B) are a plan view and an axial cross-sectional view of an eleventh embodiment of the present invention, respectively;

FIGS. 21 (A) and 21 (B) are a plan view and an axial cross-section view of a twelfth embodiment of the present invention, respectively;

FIG. 22 is a graph showing frequency characteristics of each sensor in Example 11;

FIG. 26 is a graph showing frequency characteristics of each sensor in Example 13;

FIG. 29 is a graph showing frequency characteristics of each sensor in Example 14;

FIGS. 44 (A) and (B) are a plan view and an enlarged axial cross-sectional view of a twenty-eighth embodiment of the present invention, respectively;

FIGS. 45 (A) and (B) are a plan view and an enlarged axial cross-sectional view of a twenty-ninth embodiment of the present invention, respectively;

DETAILED DESCRIPTION OF THE PREFERRED EMBODIMENTS

Figure 1A:
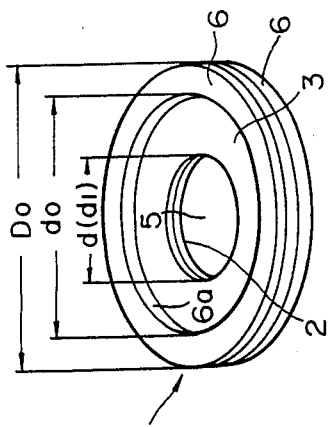
FIG. 1(A) is a plan view of a first embodiment of the present invention.
Figure 1B:
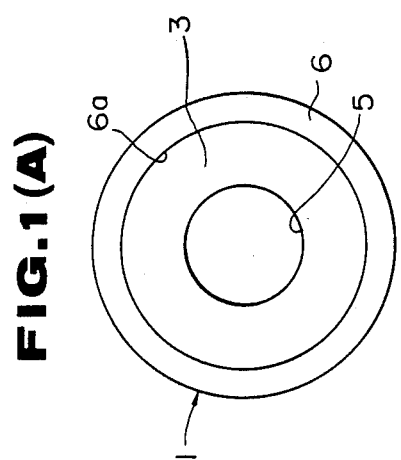
FIG. 1(B) is a perspective view of the piezo-electric acceleration sensor of FIG. 1 (A)
Figure 1C:
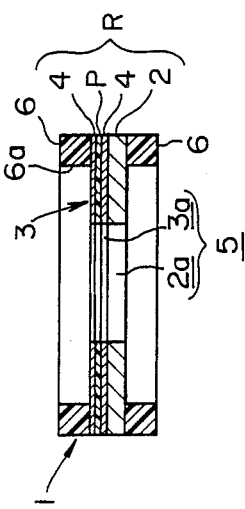
FIG. 1(C) is an axial cross-section of the piezo-electric acceleration sensor of FIG. 1 (A)

FIGS. 1(A) to 1(C) illustrate a sensing unit 1 according to one embodiment of the present invention, which includes a disc-shaped laminate R having a polymeric membrane piezo-electric element P sandwiched between a pair of opposite electrodes 4 and 4 to form a piezo-electric device. One electrode 4 is attached to a diaphragm or oscillation plate 2. The laminate R has a circular through-hole 5 concentrically formed through it and is sandwiched at peripheral portions of its opposite sides between a pair of ring-shaped fixing frames 6 and 6 in a stretched manner so that the circular through-holes 6a thereof are arranged concentrically with the through-hole 5 of the laminated R.

In this sensing unit 1, there is a relation as following:

$$D0 > d0 > d = d1$$

where D0 and d0 are the outer and inner diameters of the fixing frames 6, respectively; d is the inner diameter of the circular hole 2a of the diaphragm 2; and d1 is the diameter of the circular hole 3a of the piezo-electric element P. The oscillation portion of the laminate R, i.e., the portion, located within the circular holes 6a, of the laminate R is capable of deforming in a thicknesswise direction to oscillate.

The diaphragm 2 according to the present invention, is preferably made of a material which is relatively high in Young's modulus and in impact resistance. Use may be made of a metal, such as iron, copper and nickel, or an alloy, such as brass and stainless steel. Other high Young's modulus materials such as a composite of a synthetic resin and a carbon fiber or glass fiber may be used.

The piezo-electric element P is a disc-shaped membrane having a concentric through-hole 3a of which diameter d1 is substantially equal to the inner diameter d of the electrodes 4 and 4. The electrodes 4 and 4 are formed on the opposite sides of the piezo-electric element P by thin-film forming such as vapor deposition. One electrode 4 is concentrically laminated over one face of the diaphragm 2 by plating or bonding so that the through-holes 2a and 3a are aligned.

The piezo-electric element P or the membrane base portion of the piezo-electric device 3 may be made of a conventional material and is preferably made of a polymer; such as polyvinyl fluoride, polyvinylidene fluoride (PVDF), polyvinylidene chloride, Nylon-11, polycarbonate, poly(m-phenylene isophthalamide), copolymer of vinylidene fluoride-vinyl fluoride, copolymer of vinylidene fluoride-trifluoroethylene, and copolymer of vinylidene cyanide-vinyl acetate; or a mixture thereof with other thermoplastic resins. Furthermore, the piezo-electric element P may be made by mixing a fine powder of an inorganic piezo-electric material with a conventional thermoplastic polymer or thermosetting polymer, the inorganic piezo-electric material including, for example, $Pb(Zr,Ti)O_3$, $PbTiO_3$, $(Pb, La)(Zr,Ti)O_3$, $BaTiO_3$, $Ba(Zr,Ti)O_3$ and $(Ba,Sr)TiO_3$.

The membrane P of the piezoelectric device 3 is low in Young's modulus as compared to a ceramic piezoelectric element and hence the integral forming of the element P with the diaphragm 2 may provide a predetermined oscillation mode to the device 3 without degrading piezoelectricity, by using an appropriate thickness, diameter, and Young's modulus of the diaphragm 2.

Figure 2A:
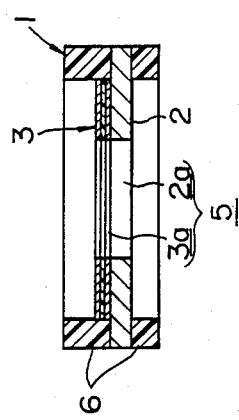
FIG. 2(A) is a perspective view of a second embodiment of the present invention.
Figure 2B:
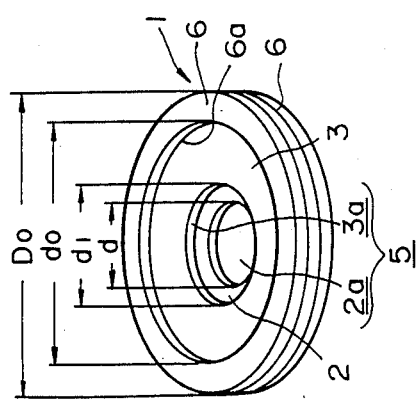
FIG. 2(B) is an axial cross-section of the piezo-electric acceleration sensor of FIG. 2 (A)

A modified form of the acceleration sensor of FIGS. 1(A) and (B) is illustrated in FIGS. 2(A) and (B), in which the through-hole 3a of the piezoelectric device 3 is larger in diameter than the through-hole 2a of the diaphragm 2, i.e., d1>d.

Figure 3:
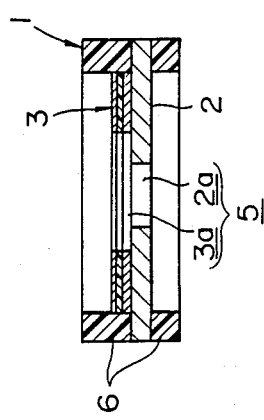
FIG. 3 is a cross-sectional view of a third embodiment of the present invention.

Another modified form of the acceleration sensor of FIGS. 1 (A) to (C) is illustrated in FIG. 3, in which the diaphragm 2 is sandwiched at its periphery between a pair of fixing frames 6 and 6, and in which the piezoelectric device 3 is bonded at its lower electrode 4 to the diaphragm 2 within the hole of the upper fixing frame 6. The acceleration sensor of FIG. 4 is distinct from the sensor of FIG. 3 in that the through-hole 3a of the piezoelectric device 3 is larger in diameter than the through-hole 2a of the diaphragm 2 as in FIGS. 2(A) and (B).

Figure 4:
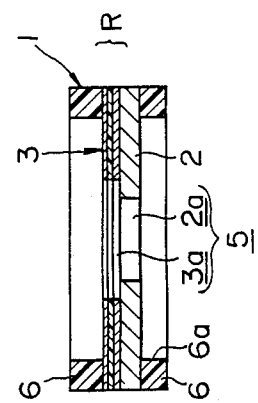
FIG. 4 is a cross-sectional view of a fourth embodiment of the present invention.

In the acceleration sensors in FIGS. 3 and 4, the inner diameter d of the laminate R and the inner diameter do of the fixing frames 6 generally follow the following formula:

$$\text{about } 0.15 \leq d/d_0 \leq \text{about } 0.8 \quad (1)$$

In other words, the area of the through-hole 5 is within the range of about 2.25 to about 64% of the area of the through-hole 6a. When the piezo-electric device hole 3a is larger in diameter than the diaphragm hole 2a, that is, in the case of the sensor of FIG. 4, the diameter of the diaphragm hole 2a is determined as the diameter d of Equation (1). The Young's modulus Eb and thickness Tb of the diaphragm 2 and the Young's modulus Ep and thickness Tp of the piezo-electric device 3 have the following relationship:

$$DRR = (Eb \times Tb^3)/(Ep \times Tp^3) \geq 5 \quad (2)$$

which is referred to as the deformation rigidity ratio DRR herein after. The thickness of electrodes 4 and 4 is negligibly small and in substance the Young's modulus Ep and thickness Tp of the piezo-electric device 3 are those of the piezo-electric element P. The upper limit of the deformation rigidity ratio DRR is defined by available materials for each member.

Figure 5:
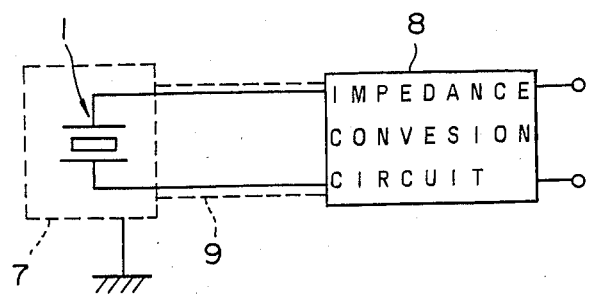
FIG. 5 is a block diagram of an electric circuit which is used in the piezo-electric acceleration sensor of the present invention.

Each sensing unit 1 of FIGS. 1 to 4 is located within a grounded shielded case 7 as in FIG. 5. Each of the electrodes 4 has a terminal (not shown) to provide electric output signals, generated by oscillating the diaphragm 2, through a low noise cable 9, and the signals are measured through an impedance conversion circuit 8.

Figure 48A:
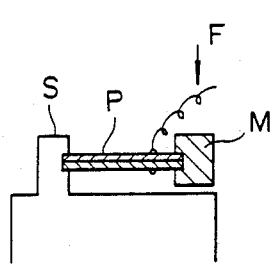
FIGS. 48 (A) and (B) are vertical cross-section views of the conventional piezo-electric acceleration sensors.
Figure 48B:
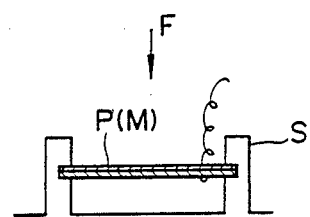

In operation, the piezo-electric device 3 is subjected to strain according to acceleration of an outer force applied to it and thus generates an electric charge Q. When the ratio of the diameter d of the hole 5 to the diameter $d_0$ of the hole 6a meets the equation (1), the output voltage is increased and becomes stable. The equation (1) provides particularly significant meaning to the increase of the output voltage. It is presumed that the diameter of holes 5 and 6a provide a large influence the oscillation mode. With $d/d_0$ smaller than about 0.15, the sensor unit becomes substantially similar to the oscillation film-type sensor unit shown in FIG. 48(B) and, on the other hand, for $d/d_0$ larger than 0.8 it functions like the cantilever-type sensor unit of FIG. 48(A).

The diaphragm 2 is considered to behave in a small deformation area as a beam symmetric about its center. The deformation rigidity of the diaphragm 2 is represented as E (Young's modulus)×I (geometrical moment of inertia), the latter varies as the third power of the thickness of the diaphragm 2. When the diaphragm 2 is substantially large in deformation rigidity compared to the piezo-electric device 3, the deformation of the sensor 1 due to acceleration depends on deformation of the diaphragm 2 without deteriorating output characteristics of the piezo-electric device 3. The deformation rigidity ratio of 5 or more as defined in Equation (2), provides stability in output voltage.

EXAMPLE 1 AND COMPARATIVE EXAMPLE 1

Figure 6:
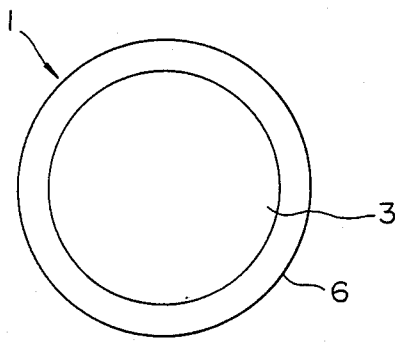
FIG. 6(A) is a plan view of a fifth embodiment of the present invention.
FIG. 6(B) is an axial cross-sectional view of the piezo-electric acceleration sensor of FIG. 6 (A)
Figure 6:
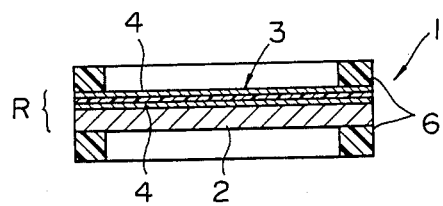

Samples #1 to #36 of piezo-electric accelerated sensors having structures shown in FIGS. 1,4 and 6(A) and (B) were prepared. The samples of FIGS. 6(A) and (B) had laminates which were blind having no hole. In each sample: the fixing frames were made of glass fiber reinforced epoxy resin; the piezo-electric element P was made of poly(vinylidene fluoride) biaxially oriented film with piezo-electric constant $d_{31}=20pC/N$ and Young's modulus $Ep=2.3 \times 10^{10} P_A$; the diaphragm was made of copper leaf with Young's modulus $Eb=13.0 \times 10^{10} P_A(Cu)$.

TABLE 1

| | $d_o$ | FIG. | $T_B$ | d | $T_P$ | $d_1$ | $d/d_o$ | DRR |
|---|---|---|---|---|---|---|---|---|
| #1 | 10 | 1 | 4.2 | 1.5 | 9 | 1.5 | 0.15 | 5.74 |
| #2 | 10 | 2 | 4.2 | 1.5 | 9 | 2.5 | 0.15 | 5.74 |
| #3 | 10 | 1 | 4.2 | 2.0 | 9 | 2.0 | 0.2 | 5.74 |
| #4 | 10 | 1 | 4.2 | 4.5 | 9 | 4.5 | 0.45 | 5.74 |
| #5 | 10 | 1 | 4.2 | 7.0 | 9 | 7.0 | 0.7 | 5.74 |
| #6 | 10 | 1 | 7 | 2.0 | 9 | 2.0 | 0.2 | 26.6 |
| #7 | 10 | 1 | 9 | 2.0 | 9 | 2.0 | 0.2 | 56.5 |
| #8 | 7 | 1 | 4.2 | 1.1 | 9 | 1.1 | 0.16 | 5.74 |
| #9 | 7 | 1 | 4.2 | 3.0 | 9 | 3.0 | 0.43 | 5.74 |
| #10 | 7 | 1 | 4.2 | 4.5 | 9 | 4.5 | 0.64 | 5.74 |
| #11 | 7 | 1 | 7 | 3.0 | 9 | 3.0 | 0.43 | 26.6 |
| #12 | 7 | 1 | 15 | 3.0 | 30 | 3.0 | 0.43 | 7.07 |
| #13 | 7 | 1 | 20 | 3.0 | 30 | 3.0 | 0.43 | 16.7 |
| #14 | 5 | 1 | 4.2 | 0.75 | 9 | 0.75 | 0.15 | 5.74 |
| #15 | 5 | 1 | 4.2 | 1.0 | 9 | 1.0 | 0.2 | 5.74 |
| #16 | 5 | 1 | 4.2 | 3.5 | 9 | 3.5 | 0.7 | 5.74 |
| #17 | 5 | 1 | 15 | 1.0 | 30 | 1.0 | 0.2 | 7.07 |
| #18 | 5 | 1 | 20 | 1.0 | 30 | 1.0 | 0.2 | 16.7 |
| #19 | 10 | 3 | 4.2 | 1.5 | 9 | 1.5 | 0.15 | 5.74 |
| #20 | 10 | 4 | 4.2 | 1.5 | 9 | 2.5 | 0.15 | 5.74 |
| #21 | 7 | 3 | 4.2 | 1.1 | 9 | 1.1 | 0.16 | 5.74 |
| #22 | 7 | 4 | 4.2 | 1.1 | 9 | 1.5 | 0.16 | 5.74 |
| #23 | 5 | 3 | 4.2 | 1.0 | 9 | 1.0 | 0.2 | 5.74 |
| #24 | 5 | 4 | 4.2 | 1.0 | 9 | 2.0 | 0.2 | 5.74 |
| #25 | 10 | 1 | 3.0 | 1.5 | 9 | 1.5 | 0.15 | 2.1 |
| #26 | 10 | 1 | 4.2 | 1.0 | 9 | 1.0 | 0.1 | 5.74 |
| #27 | 10 | 1 | 4.2 | 8.0 | 9 | 8.0 | 0.8 | 5.74 |
| #28 | 10 | 4 | 3.0 | 1.5 | 9 | 1.5 | 0.15 | 2.1 |
| #29 | 10 | 4 | 4.2 | 1.0 | 9 | 1.0 | 0.1 | 5.74 |
| #30 | 10 | 4 | 4.2 | 8.0 | 9 | 8.0 | 0.8 | 5.74 |
| #31 | 7 | 1 | 3.0 | 1.5 | 9 | 1.5 | 0.15 | 2.1 |
| #32 | 7 | 1 | 4.2 | 1.0 | 9 | 1.0 | 0.1 | 5.74 |
| #33 | 7 | 1 | 4.2 | 8.0 | 9 | 8.0 | 0.8 | 5.74 |
| #34 | 10 | 6 | 4.2 | — | 9 | — | — | 5.74 |
| #35 | 7 | 6 | 4.2 | — | 9 | — | — | 5.74 |
| #36 | 5 | 6 | 4.2 | — | 9 | — | — | 5.74 |

TABLE 2

| | Frequency dependency | | Output ratio | S. R. |
|---|---|---|---|---|
| | (5~10 Hz) | (10~100 Hz) | (1G) | (db) |
| #1 | good | good | 4.2 | 20 |
| #2 | good | good | 4.0 | 19 |
| #3 | good | good | 4.0 | 19 |

TABLE 2-continued

| | Frequency dependency | | Output ratio | S. R. |
|---|---|---|---|---|
| | (5~10 Hz) | (10~100 Hz) | (1G) | (db) |
| #4 | good | good | 3.8 | 21 |
| #5 | good | good | 3.3 | 23 |
| #6 | good | good | 3.5 | 20 |
| #7 | good | good | 3.0 | 18 |
| #8 | good | good | 3.2 | 17 |
| #9 | good | good | 2.9 | 19 |
| #10 | good | good | 2.5 | 20 |
| #11 | good | good | 2.6 | 23 |
| #12 | good | good | 2.3 | 21 |
| #13 | good | good | 2.0 | 20 |
| #14 | good | good | 2.5 | 20 |
| #15 | good | good | 2.3 | 20 |
| #16 | good | good | 2.1 | 18 |
| #17 | good | good | 2.1 | 19 |
| #18 | good | good | 2.0 | 21 |
| #19 | good | good | 4.2 | 21 |
| #20 | good | good | 3.9 | 23 |
| #21 | good | good | 3.4 | 22 |
| #22 | good | good | 3.2 | 22 |
| #23 | good | good | 2.5 | 20 |
| #24 | good | good | 2.2 | 20 |
| #25 | unacceptable | unacceptable | 5.3 | 18 |
| #26 | unacceptable | good | 4.3 | 19 |
| #27 | good | good | 1.3 | 19 |
| #28 | unacceptable | unacceptable | 5.5 | 17 |
| #29 | unacceptable | good | 4.4 | 18 |
| #30 | good | good | 1.4 | 19 |
| #31 | unacceptable | unacceptable | 4.9 | 18 |
| #32 | unacceptable | good | 4.0 | 19 |
| #33 | good | good | 1.1 | 19 |
| #34 | unacceptable | unacceptable | — | 8 |
| #35 | unacceptable | unacceptable | — | 9 |
| #36 | unacceptable | unacceptable | — | 9 |

TABLE 3

| | $d_o$ | FIG. | $T_B$ | d | $T_P$ | $d_1$ | $d/d_o$ | DRR |
|---|---|---|---|---|---|---|---|---|
| #37 | 15 | 1 | 30 | 6 | 30 | 6 | 0.40 | 56.5 |
| #38 | 15 | 1 | 30 | 6 | 30 | 8 | 0.53 | 56.5 |
| #39 | 15 | 1 | 30 | 6 | 30 | 10 | 0.67 | 56.5 |
| #40 | 15 | 1 | 10 | 6 | 30 | 9 | 0.60 | 6.3 |
| #41 | 15 | 1 | 10 | 6 | 30 | 3 | 0.20 | 6.3 |
| #42 | 15 | 1 | 30 | 6 | 30 | 14 | 0.93 | 56.5 |
| #43 | 15 | 1 | 25 | 6 | 30 | 6 | 0.40 | 0.3 |

TABLE 4

| | Attachment | $\frac{Eb \cdot Tb^3}{Ep \cdot Tp^3}$ | Shift (%) | Directionality (%) |
|---|---|---|---|---|
| #44 | Plating | 72.8 | 0.5 | 0.8 |
| #45 | Bonding | 123.0 | 3.0 | 5.0 |
| #46 | Plating | 2.1 | 0.3 (0.1G~1G) 5.0 (1G~10G) | 18.0 |

TABLE 4A

| | FIG. | $T_I$ | DRR3 | Output after test |
|---|---|---|---|---|
| #47 | 10 | 20 μm | 146.3 | 98% |
| #48 | 10 | 40 μm | 18.3 | 97% |
| #49 | 1 | — | — | 65% |
| #50 | 10 | 350 μm | 0.03 | 95% |

The specifications of the samples are given in Table 1 where $d_0$(mm), Tb(μm), d(mm), Tp(μm), D1(mm) and DRR represent the diameter of the hole 6a, thickness of the diaphragm 2, diameter of the hole 2a, thickness of the piezo-electric film or element P, diameter of the hole 3a and the deformation rigidity ratio, respectively. The results of the tests on the samples are given in Table 2, in which: the output ratio was the ratio of output voltages of a piezo-electric unit having a through-hole 5 and a piezo-electric unit blind (without any through-hole), when 200 Hz, 1 G sinusoidal oscillation acceleration was applied; and the sensitivity ratio S.R. is the ratio of the output voltage in application of acceleration in parallel with the plane of the piezo-electric element P to the output voltage in application of acceleration vertical to the plane thereof (crosstalk).

From Table 2, it was confirmed that: the samples #1–24 and #27, #30 and #33, which fall within the scope of the invention, provided extremely high output voltages as compared to samples in which laminates had no hole; frequency characteristics thereof were flat; and output characteristics thereof did not depend on frequency and were stable. It is to be noted that the characteristics of these samples did not depend on the thickness of PvDF films and structures of FIGS. 1 to 4.

EXAMPLE 2 AND COMPARATIVE EXAMPLE 2

Figure 9:
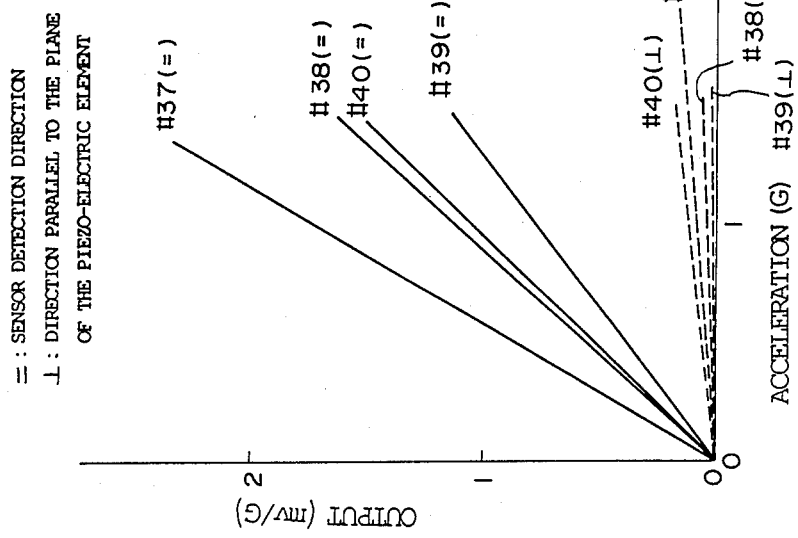
FIG. 9 is a graph showing output versus acceleration curves of sensors in Example 2.
Figure 8:
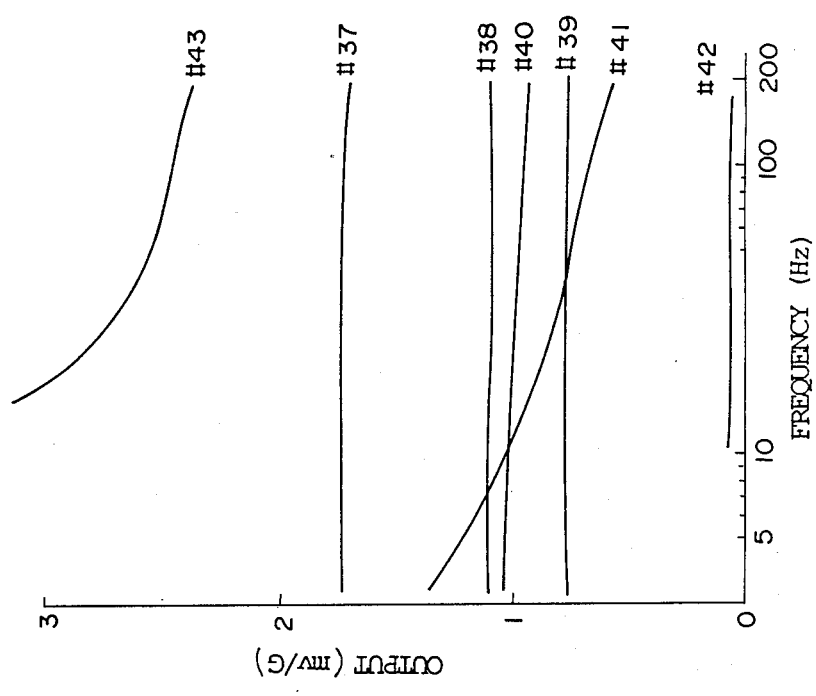
FIG. 8 is a graph showing frequency characteristics of each sensor in Example 2.

Samples #37 to #43 were made of the same materials as samples #1 to #36 except that the diaphragm of the sample #43 was made of polyethylenetelephtalate (PET) with Young's modulus $1.2 \times 10^9$ PA. The parameters of these samples are given in Table 3. The empirical results are plotted in FIGS. 8 and 9. The relationship of output voltage (mV/G) versus frequency is illustrated in FIG. 8 and the relationship of output voltage versus oscillation acceleration is shown in FIG. 9. The characters and = indicate acceleration application directions perpendicular to and parallel to the plane of each laminate R, respectively. From the results, it is apparent that samples #37–41 (Example 2), particularly sample #37–40 (about $0.3 \leq d/d_0 \leq$ about 0.8 and DRR ratio was more than about 5), were stable in frequency characteristics as compared to samples #42 and 43 (Comparative Example 2). The samples #37–40 were also excellent in both linearity and directivity.

The diaphragm 2 may be formed by plating a metal to one electrode 4 if the laminate R meets Equations (1) and (2). The metal preferably has a relatively high Young's modulus and high impact resistance and hence may be a metal, such as iron, copper, nickel, chromium, gold, silver and tin, or an alloy, such as copper-tin alloy and nickel alloy. In this case, the electrode 4 is made of a material which may not be corroded by the plating liquid since it is used as a cathode in the plating. As the material for the electrode 4, a metal, such as gold, platinum, nickel, iron and copper, or an alloy, such as brass and stainless steel may be used.

EXAMPLE 3 AND COMPARATIVE EXAMPLE 3

Samples #44–45 (Example 3) and #46 (Comparative Example 3) were prepared, each having a structure similar to the structure of FIG. 1 and having the following specifications:

Sample #44: $d_0 = 12$ mm; the piezo-electric element was made of a 28 μm thick poly(vinylidene fluoride) biaxially oriented film with Young's modulus $2.2 \times 10^9$ $P_A$; the electrodes 4 were made by forming 0.3 μm thick nickel layer with vapor deposition under heating; the diaphragm was made by nickel plating with a thickness 26 μm and Young's modulus $20.0 \times 10^{10}$ $P_A$; and the laminate had a thickness $d = d_1 = 9$ mm.

Sample #45: the diaphragm was made of a 30 μm thick nickel leaf with Young's modulus $22.0 \times 10^{10}$ PA and was bonded to the piezo-electric device with epoxy resin; and other conditions were the same as in the sample #44.

Sample #46: the diaphragm was made by nickel plating and had a thickness 8 μm; and other conditions were the same as the sample #44.

The samples underwent tests in which the shift and directivity of output were measured when an outer force was applied with a 20 Hz oscillation acceleration of 0.1 to 10 G. The results are given in Table 4, in which the output shift means the shift in percentage from linearity of output characteristics, and the directivity means the proportion in percentage, of the output in the direction of the sensor detection to the output in a direction perpendicular to the sensor detection direction. From Table 4, it is clear that sample #44 was excellent in output shift and directivity in spite of the fact that the diaphragm thereof was thinner than the diaphragm of the sample #45.

Figure 10A:
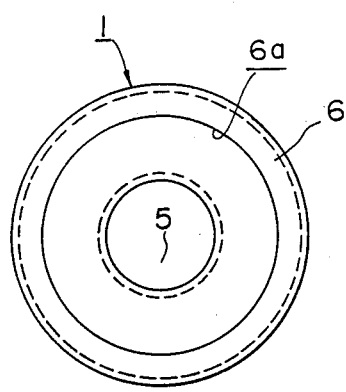
FIGS. 10(A) and (B) are a plan view and an axial cross-sectional view of the fifth embodiment of the present invention, respectively.
Figure 10B:
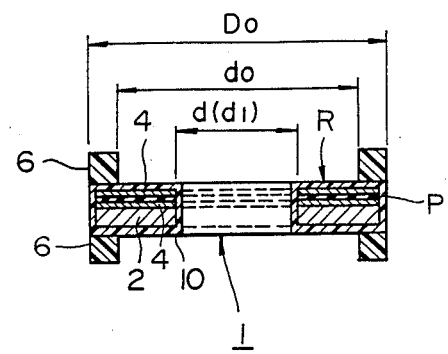

FIGS. 10(A) and 10(B) illustrate another modified form of the sensing unit of FIG. 1, which is distinct from the latter in that the laminate R is covered with a protection film 10 for protecting it from environmental conditions such as rapid changes in temperature and humidity. In the sensor unit in FIG. 11 (A) and (B), the whole unit is covered with the protection film 10. The protection film 10 may be formed by applying to the laminate R or the whole unit 1, a thermosetting resin, such as an epoxy resin or silicone resin, a photosetting resin, or a paint having such resins dissolved with a solvent. A paint having a thermoplastic resin, such as polyethylene resin, or an inorganic material, such as $SiO_2$, dissolved with a solvent may be used. Furthermore, the protection film may be formed by vapor depositing or sputtering an organic material, such as a polyethylene and polyparaxylene, or an inorganic material such as $SiO_2$.

Figure 11A:
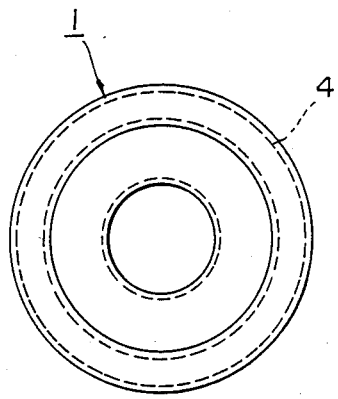
FIGS. 11(A) and (B) are a plan view and an axial cross-sectional view of the sixth embodiment of the present invention, respectively.
Figure 11B:
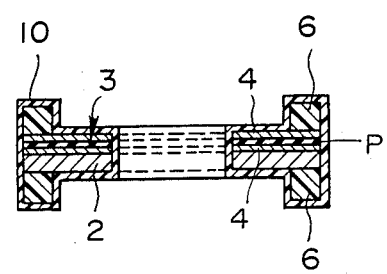

In each of these modified sensor units of FIGS. 10 and 11, the diaphragm 2 and the protection film 10 generally have the following relationship:

$$DRR = (E_b \times T_b^3)/(E_i \times T_i^3) \geq 10 \qquad (3)$$

where $E_i$ and $T_i$ are Young's modulus and thickness respectively of the protection film. When the ratio in deformation rigidity of the diaphragm over the protection film meets the conditions of equation (3), the influence of the protection film becomes substantially small, so that deterioration in the output characteristics due to the protection film falls within an acceptable range.

EXAMPLE 4 AND COMPARATIVE EXAMPLE 4

Samples #47 and 48 (Example 4) and Samples #49 and 50 (Comparative Example 4) were prepared, having the following specifications: Samples #47, 48 and 50 had a structure as in FIG. 10 with an epoxy resin protection film having Young's modulus $3.0 \times 10^9$ $P_A$. The sample #49 had a structure of FIG. 1 without any protection film. In each sample: the fixing frames had a through-hole 6a diameter $d_0 = 12$ mm; the piezo-electric element P was made of poly(vinylidene fluoride) biaxially oriented film with piezo-electric constant $d_{31} = 20pC/N$ and Young's modulus $E_p = 2.2 \times 10^9$ $P_A$; the diaphragm was made of 30 μm copper leaf with Young's modulus $E_b = 13.0 \times 10^{10}$ $P_A$(Cu); and The diameter of the hole 5 $d = d_1 = 9$ mm.

Figure 12:
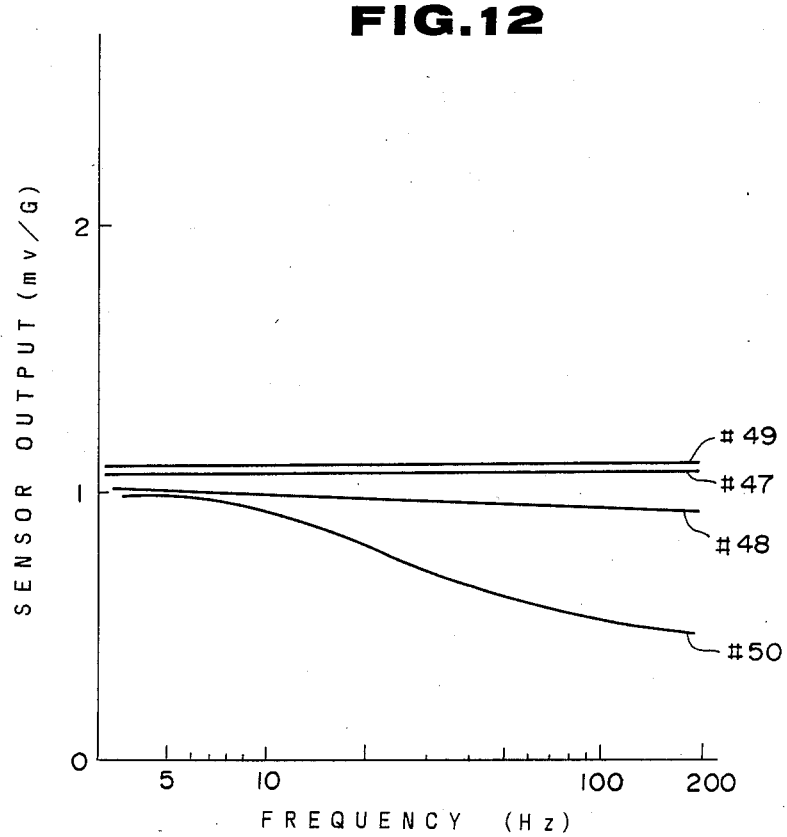
FIG. 12 is frequency characteristics of the output of in Example 4.

The samples were subjected to a heat cycle test in which outputs before and after the test were compared when a 20 Hz sensor acceleration frequency was applied. The heat cycle test was carried out with a temperature range of −20° C. to 80° C., a temperature gradient of 10° C./hour, and 10 heat cycles. The results of the test are given in Table 4, from which it is clear that samples #47, 48 and 50 exhibited little degradation in output after the heat cycle test as compared to sample #49. Subsequently, each sample was tested to determine output characteristics when the acceleration frequency was varied in a low frequency range below 200 Hz. The results are plotted in FIG. 12, from which it was confirmed that samples #47, 48 and 49 which met the equation (3) exhibited flat output characteristics and that sample #50 was inferior in output characteristics due to excessive thickness of the protection film. Accordingly, sample #47 and 48 which satisfied both equations (2) and (3) provided excellent performances.

Figure 14:
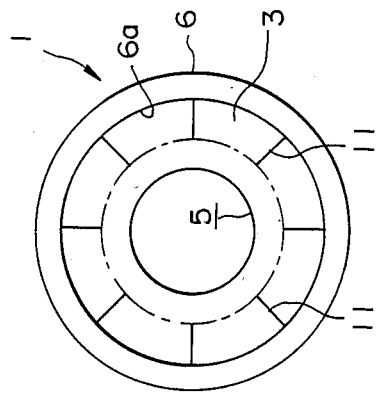
FIGS. 13 and 14 are plan views of seventh and eighth embodiments of the present invention, respectively.
Figure 13:
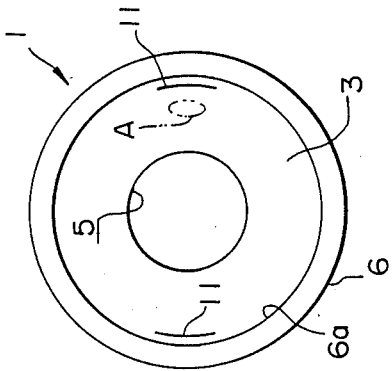

FIGS. 13 and 14 show a modified sensing unit 1 the same as FIG. 1 except that mechanical transmission barriers 11 are formed in the peripheral portions of the laminates R thereof. The sensing unit of FIG. 13 had a pair of peripheral slits as the mechanical barrier 11 formed through peripheral portions of the laminate R, and the sensing unit of FIG. 14 had a plurality of (eight in this embodiment), axial slits, as the mechanical barrier 11, formed through the laminate R to extend from the periphery thereof toward the center thereof with an equal length and to be symmetrical with respect to the center.

EXAMPLE 5

Samples #51 and 52, which had a structure similar to the sensor of FIG. 1, were prepared, in each of which the laminate R included a 30 μm thick copper leaf diaphragm 2; and a piezo-electric device 3 having a piezo-electric element made of a 30 μm thick poly(vinylidene fluoride) biaxially oriented film, and electrodes. The laminate R of each sample was formed by bonding the piezo-electric device 3 to the diaphragm 2 with an epoxy resin adhesive, which was hardened by heating at 90° C. for 30 min. Each sample had a 15 mm diameter through-hole 6a at the fixing frame 6 and a 7 mm diameter through-hole 5 at the laminate R. The sample 51 had no mechanical barrier. The sample 52 had a loosened portion A in the laminate R near the periphery thereof. The loosened portion A might have been produced by stresses during fabrication thereof. A slit 11 was formed in the vicinity of the loosened portion A and another slit 11 was formed at the opposite portion as illustrated in FIG. 13. Frequency characteristics of the samples were measured and the results were as follows: Sample #51 had a resonance frequency of about 3 kHz with a stability detection frequency range 1 kHz to 10 Hz but sensitivity was rather deteriorated below 10 Hz; and sample #52 had a resonance frequency of about 2.5 kHz with a stability detection frequency range of 1 kHz to 2 Hz.

EXAMPLE 6

Influences of temperature change on the mechanical barrier were tested. The previous sample #52 and a new sample #53 were used. The sample #53 had a structure as in FIG. 14. The samples were tested as to temperature characteristics, in which case 60 Hz, 1G acceleration was applied to each sample within a temperature range from −30° C. to +70° C. Sample #52 exhibited an output value of 0.85 at −30° C. and 3.7 at 70° C. for a reference output value of 1 at room temperature. Sample #53 showed an output value of 0.95 at −30° C. and 2.0 at 70° C. for a reference output value of 1 at room temperature. From these results, it was found that the sensor unit with mechanical barriers provided wide detection frequency characteristic as compared to the sensor unit without mechanical barriers, and that it was preferable to form slits from the periphery to the center of the circular laminates for improving temperature characteristics.

FIGS. 16(A) and (B) show a modified form of the sensor unit of FIG. 1, in which modified form the sensor unit 1 with fixing frames 6 and 6, having outer diameter 15 mm and inner diameter 10 mm, and is secured to a base 14 by fastening a stainless steel securing disc 12, having a 15 mm diameter, which is placed over the upper fixing frame 6, with fastening members 13 which includes a nut 13a attached to the base 14 and a machine screw 13b. The securing disc 12 depresses the fixing frames with uniform load along their peripheral portions. The nut 13a passes through the hole 5 with a gap and hence the laminate R within the hole 6a of the fixing frames 6 and 6 can oscillate in the thicknesswise direction or axial direction as in the preceding embodiments. The piezo-electric element 3 is made of a polymer film, such as of PvDF polarized and has a throughhole 3a substantially equal or larger in diameter than the through-hole 2a of the diaphragm 2. The piezo-electric element 3 and the diaphragm 2 are bonded to form the laminate R. The cross-sectional area of the nut 13a (plus the machine screw 13b) is not larger than 85% of the area of the hole 5. The fastening members 13 having such a size allow air to freely flow through the gap between the nut 13a and the wall of the hole 5, thus providing a stable output without producing a current collecting effect which may cause drift or noise. The piezo-electric element 3 has terminals attached to it for carrying signals generated due to strain, the signals being detected through the impedance conversion circuit 8 as illustrated in FIG. 5.

The securing member 12 may be in the shape of a cross instead of disc as shown in FIG. 15 and it may have more than four legs, which extend radially outward at regular angular intervals around the center thereof, and of which distal ends are secured to the upper fixing frame 6.

EXAMPLE 7

Figure 17:
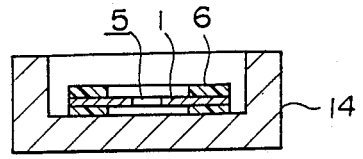
FIGS. 17 to 19 (A) are axial cross-sectional views of conventional attaching mechanisms of sensor.

A sample sensor unit #54, having a structure as shown in FIG. 16, was prepared, having the following specifications: 1 mm thick fixing frames of a thick paper-phenolic resin laminate plate with outer diameter 15 mm and inner diameter 10 mm; a 30 μm piezo-electric element of PVDG film; a 30 μm copper foil diaphragm; the hole 5 of the laminate R having a diameter d=5 mm; and 0.5 mm thick stainless securing disc 12. The sample #54 was fastened through the fastening member 13 to a base, as the base 14, of an oscillation test machine, where a test was made. As shown in FIG. 17, another sample, having the same structure as the sample #54, was secured to a base 14 of the oscillation test machine with pressure sensitive adhesive double coated tape (not shown).

From the results of the test, it was noted that the sensor unit of FIG. 17 provided ⅓ of the output of the sensor unit of FIG. 16. It is believed that the sensor unit of FIG. 16 efficiently transmits oscillation to the piezoelectric device while in the sensor unit of FIG. 17, the adhesive double-coated tape served as a cushion layer which absorbed some of the oscillations.

EXAMPLE 8

Figure 18:
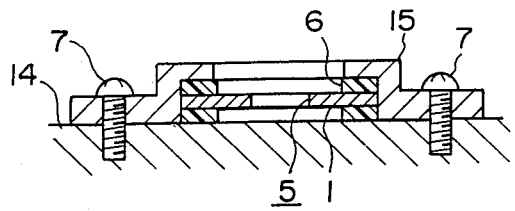

A sensor unit, having the same structure as the sample #54 was secured to a base 14 with a securing jig 15 and machine screws 7, as shown in FIG. 18, to produce a test piece, which underwent an impact test, in which it was dropped from a 1 m height to a concrete block (at 2000 G). This test was carried out 100 times and it was found that in seven of 100 sensor units machine screws 7 became loose, resulting in 70% of the initial output.

The fixing frames of a sensor unit having the same structure as the sensor unit of sample #54 were secured to a base 14 by means of four machine screws 13b to produce a test piece which underwent the same impact test, which became loose, resulting in 70% of the initial output 13b of five of 100 pieces became loose, resulting in 70% of the initial output.

Figure 19A:
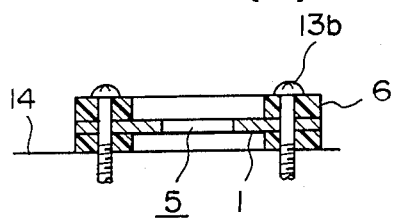
Figure 19B:
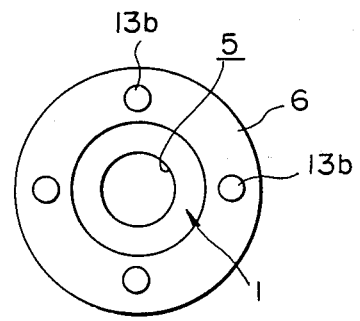

Test pieces, having similar sensor units to the test pieces above described, were built with the structure as illustrated in FIGS. 19(A) and (B) and were subjected to the same impact test, for which it was found that none of 100 test pieces had loosened machine screws 13b, and that decrease of output was within 5% of the initial output.

EXAMPLE 9

A test was conducted, in which the output of a test piece having the structure of FIG. 16 was measured when the area of the gap between the wall of the hole 5 and the nut 13a varied by 5% to 50% of the area of the hole 5. The results are given in Table 5, in which the output stability is a ratio of a drift at 50° C., where in the temperature had been elevated by heating the sensor unit from its one side at a speed of 50° C./min, to an output at a released state, where the drift=(output at 50° C.)-(output at the released state). From the table 5, it was noted that a gap having 15% or more of the area of the hole 5 provided stable outputs.

TABLE 5

| Area of gap/area of hole 5(%) | 15 | 30 | 50 | 10 | 5 |
|---|---|---|---|---|---|
| Output stability(%) | ±4 | ±1 | ±1 | ±15 | ±20 |

Another modified form of the sensing unit 1 of FIG. 1 is illustrated in FIGS. 20(A) and (B), in which the diaphragm 2 is directly bonded to a piezo-electric element P with an adhesive. The diaphragm 2 serves as another electrode 4 in this modification. In this modification, the hole 5 of the laminate has a rectangular shape formed through its central portion in a 180 degree symmetrical arrangement with respect to the center, thus locating the intersecting point of the diagonals thereof at the center of the laminate R. The shorter side $D_1$ of the rectangular hole 5 and the inner diameter $D_0$ of the fixing frame 6 meets the following equation:

$$0.2 \leq D_2/D_0 \leq 0.8 \tag{4}$$

When the breaking strength of the piezo-electric element P, such as of polyvinylidene fluoride biaxially oriented film, is different in two directions, it is arranged so that the maximum breaking strength direction of the element P meets the direction of the shorter side $D_2$ at an angle $\theta$ within 10 degrees.

FIGS. 21(A) and 21(B) illustrate another modified form of the sensing unit 1 of FIG. 1, in which modified form the through-hole 5 is in the form of a rhombus which has a longer diagonal $D_1$ and shorter diagonal $D_2$. In this modification, the direction of the shorter diagonal $D_2$ and the direction of the longer diagonal $D_1$ are determined as shown in the figures. The direction of the shorter diagonal $D_2$ and the direction of the maximum breaking strength form the angle $\theta$.

EXAMPLE 10

Samples #55–56 and #58–60, which have structures shown in FIGS. 20 or 21, and samples #57, which had the structure (without any hole) of FIG. 1, were prepared, each sample having 9 microns thick piezo-electric PVDF biaxially oriented film piezo-electric elements, 5 micron thick nickel leaf diaphragms and fixing frames with inner diameter $D_0 = 7$ mm. Other specifications of the samples are as follows: sample #55 had the structure of FIG. 20 with $D_1 = 5$ mm, $D_2 = 2$ mm and angle $\theta = 3$ degrees; sample #56 had the structure of FIG. 21 with $D_1 = 5$ mm, $D_2 = 2$ mm, angle $\theta = 0$; sample #58 had the structure of FIG. 20 with $D_1 = 6$ mm, $D_2 = 5.8$ mm and $\theta = 5$ degrees; sample #59 had the structure of FIG. 21 with $D_1 = 6$ mm, $D_2 = 5.8$ mm and angle $\theta = 3$ degrees; and sample #60 had the structure of FIG. 21 with $D_1 = 5$ mm, $D_2 = 2$ mm and angle $\theta = 45$ degrees.

Directivity output was measured on each sample by applying 200 Hz, 1G sinusoidal oscillation acceleration. The directivity output is defined as the percentage of the output voltage V, which is provided when acceleration oscillation is applied in parallel with the plane of the piezo-electric element, to the output voltage which is generated when it is applied in the thicknesswise direction (main sensitivity axis direction) thereof.

TABLE 6

| Sample # | \multicolumn{6}{c|}{Directivity output (%)} |
|---|---|---|---|---|---|---|
| | 55 | 56 | 57 | 58 | 59 | 60 |
| % | 5 ± 2 | 4 ± 1 | 20 ± 5 | 11 ± 4 | 10 ± 3 | 7 ± 3 |

EXAMPLE 11

Sample #55 to 3#60 were prepared, and output voltage was obtained by applying sinusoidal oscillation at acceleration of 1 G in the frequency range from 2 Hz to 500 Hz. FIG. 22 shows output characteristics.

Referring above results in Table 6 and FIG. 22, sample #55 and sample #56 provided larger output in the main sensitivity axis direction than in a direction perpendicular to the main sensitivity axis direction. The samples #55 and #56 had excellent directivity and stable output.

And referring to the results of sample #60 whose angle $\theta$ is 3° and sample #55 whose angle $\theta$ was 45°, a remarkable difference between their outputs was noted. Thus, the reducing of the angle $\theta$ is an effective means for increasing the output.

Figures 23A, 23B:
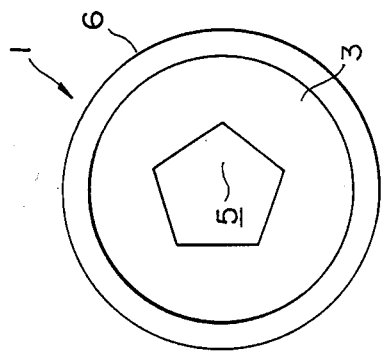
FIGS. 23 (A) and (B) are a plan view and an axial cross-sectional view of thirteenth embodiment of the present invention, respectively.

FIGS. 23 (A) (B) illustrate a sensing unit 1 according to one embodiment of the present invention, which includes a disk-shaped laminate R having a disk-shaped diaphragm or oscillation plate 2, polymeric membrane piezo-electric element P made of a high polymer bonded on the surface of the diaphragm 2, and an electrode 4 attached on a surface of the piezo-electric element P. The diaphragm 2, the piezo-electric element P, and the electrode 4 are laminated in one body to form a laminate R. The laminate R has a pentagonal through-hole 5 concentrically formed through it and it is sandwiched at peripheral portions of its opposite sides between a pair of ring-shaped fixing frames 6 and 6 in a stretched manner so that the circular through-holes $6a$ thereof are arranged concentrically with the through-hole 5 of the laminate R.

The diaphragm 2, which vibrates when force is applied at its surface, is made of 5 mm thick nickel leaf to be more rigid than piezo-electric element P. There is a relation described in the following formula between the diaphragm 2 and the piezo-electric element P;

$$(E_B \times T_B^3) / (E_P \times T_P^3) \geqq 5$$

wherein $E_B$ is elastic modulus of the diaphragm 2, $T_B$ is thickness of the diaphragm 2, Ep is elastic modulus of the piezo-electric element P, and Tp is thickness of the piezo-electric element P.

The piezo-electric element P is made of high polymer, for instance oriented polyvinylidene fluoride film whose thickness is 9 mm and is shaped substantially to the same shape as the diaphragm 2.

The electrode 4, which is made of a metal conductor material, is coated on a surface of the piezo-electric element P by thin-film forming, for instance vacuum deposition.

EXAMPLE 12

Sample #61 to #68 of piezo-electric acceleration sensors, having structures shown in FIG. 23 and similar structures were manufactured and prepared changing the number of angles in the polygonal through-hole and the ratio between cross-section area of the through-hole 5 and the area of the fixing frame 6 contacting the laminate R.

Conditions of the experiment are described as follows; The material of the high polymer piezo-electric element was an oriented piezoelectric polyvinylidene fluoride film; thickness of the piezo-electric element was 9 mm; material of the diaphragm was nickel leaf; thickness of the diaphragm was 10 mm; outer diameter of the fixing frame was 12 mm; inner diameter of the fixing frame was 10 mm. And an output voltage of sinusoidal oscillation for measuring was 1 G; and frequency of the oscillation is below 10 Hz; is normalized. TABLE 7 shows the ratio between the detected output and the normalized output under the above condition.

TABLE 7

| | \multicolumn{8}{c|}{Detection Output Voltage Ratio (%)} |
|---|---|---|---|---|---|---|---|---|
| Sample # | 61 | 62 | 63 | 64 | 65 | 66 | 67 | 68 |
| hole* | b | t | t | t | t | t | t | t |
| Number of the Corner of the polygonal hole | — | 5 | 11 | 5 | 7 | 7 | 11 | 11 |
| Ratio of the Hole area | 0 | 10 | 90 | 20 | 20 | 80 | 20 | 80 |
| Voltage Ratio | — | 1.1 | 0.9 | 1.8 | 1.9 | 1.7 | 2.0 | 1.8 |

*shows whether there is a hole or not: b indicates blind; t indicates through-hole.

Referring to Table 7, the output ratios of sample #61 to #63 are remarkably larger than the output ratios of sample #64 to #68 corresponding to the 13th embodiment. Hitherto, if the through-hole 5 is an equilateral polygon that has more than 5 angles, and the cross-sectional area of the through-hole is within the limit from 20 to 80 percent of the area of the fixing frame contacting the laminate R, the output ratios are remarkably large. Especially, the sample #61 that has no through-hole generates an output that is the same as the normalized output.

OTHER EXAMPLES

In the above description, it is allowable to change material or configuration of the fixing frame 6, if its inner hole is circular and its material is rigid and hard enough to resist transforming.

And in the elements of the laminate, it is possible to change the method for fixing the diaphragm to the piezo-electric element as one body, or the materials.

Figure 24A:
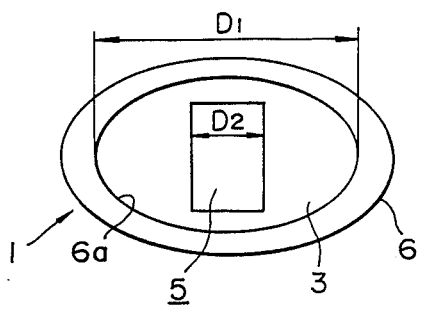
FIGS. 24 (A) and (B) are a plan view and an axial cross-sectional view of a fourteenth embodiment of the present invention, respectively.
Figure 24B:
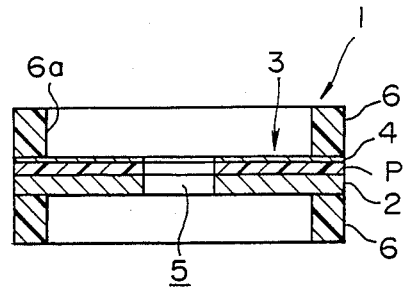

FIGS. 24 (A), (B) and 25 illustrate a sensing unit 1 according to one embodiment of the present invention. The sensing unit 1 has the same structure as the unit in Example 12 in FIGS. 23 (A) (B) except as follows, i.e., laminate R is elliptical-plate-shaped; a diaphragm or an oscillation plate 2, a piezo-electric element P, and an electrode 4 are elliptical-plate-shaped; a fixing frame 6 is an elliptical ring; and a through-hole 5 is a rectangle whose longer side is along the minor axis of the elliptical hole 6a. The through-hole 5 is shaped in the manner of the following formula.

$$0.2 \leq D_2/D_1 \leq 0.8$$

Wherein $D_1$ is the length of the major axis of the hole 6a and $D_2$ is the length of a shorter side of the hole 5. If the breaking strength in various directions on the surface of the piezo-electric element P is different, the fixing frame 6 is attached in a manner that the major axis is seen to deviate no greater than 10° from an identical direction.

Figure 25:
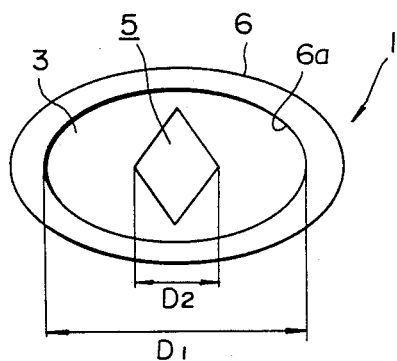
FIG. 25 is a plan view of a fifteenth embodiment of the present invention.

On the other hand, FIG. 25 illustrates another embodiment of the invention. The unit 1 in FIG. 25 has the same structure as the unit in FIG. 24 except that the through-hole is a rhombus and its major diagonal agrees with the minor axis of the fixing frame 6.

EXAMPLE 13

Samples #69 to #75 of piezo-electric acceleration sensors having the structures shown in FIGS. 24 and 25 similar structures were prepared and the ratio of output voltage Vs to output voltage Vm was determined when the size and shape of the square and rhombic through-holes and the direction of the maximum breaking strength were varied, where the output voltage Vm was given by applying acceleration oscillations perpendicular to each sample in the main sensitivity axis direction, i.e., in the thicknesswise direction of the piezo-electric acceleration; and the output voltage Vs was given by applying acceleration oscillation perpendicular to the main sensitivity axis direction, i.e., in parallel with the plane of the piezo-electric device. In each sample, the laminate, which had 9 mm thick piezo-electric polyvinylidene fluoride biaxially oriented film plated with 10 mm thick nickel leaf layer, was held in elliptical-ring-shaped fixing frames having a 12 mm major axis and 10 mm minor axis elliptical through-hole 6a, and output voltages were detected by applying 200 Hz and 1 G sinusoidal oscillation acceleration.

In the following description, if the through-hole is rectangular, the difference in angle between the direction agreeing to the maximum breaking strength and the direction of the shorter side is determined as $\theta$. Similarly, if the through-hole is rhombic, the difference in angle between the direction agreeing to the maximum breaking strength and the direction of the shorter diagonal is determined as $\theta$. And, difference in angle between the direction agreeing with the maximum breaking strength and the direction of the major axis of the frame is determined as $\phi$.

(1) Sample #69 in FIG. 24
Figure of the through-hole: rhombic (7 mm major axis×4 mm minor axis) $\theta=0°$. $\phi=0°$ (2) Sample #70 in FIG. 25
Figure of the through-hole: rectangular (5 mm longer side×4 mm shorter side) $\theta=0°$. $\phi=0°$.

(3) Sample #71
Through-hole: none $\phi=0°$ (4) Sample #72
Through-hole: none $\phi=90°$ (5) Sample #73
Figure of the through-hole: rectangular(9.9 mm longer side×9.8 mm shorter side) $\theta=0°$. $\phi=0°$ (6) Sample#74
Figure of the through-hole: rhombic (9.9 mm major axis 9.7 mm minor axis) $\theta=0°$. $\phi=0°$ (7) Sample #75
Figure of the through-hole: rectangular(5 mm longer side×3 mm shorter side) $\theta=45°$. $\phi=0°$.

TAB. 8 shows the result of the test.

TABLE 8

| | DETECTABLE OUTPUT VOLTAGE RATIO | | | | | | |
|---|---|---|---|---|---|---|---|
| | Sample # | | | | | | |
| | 69 | 70 | 71 | 72 | 73 | 74 | 75 |
| Voltage Ratio | 4±1 | 5±2 | 22±5 | 25±5 | 15±7 | 13±4 | 16±6 |

Next, samples #69 to #75 were tested, that is, output voltage from the samples was measured changing the sinusoidal oscillation acceleration in the area from 2 Hz to 500 Hz. FIG. 26 illustrates the results of this test.

Referring to the results in TABLE 8, samples #69 and #75 have a characteristic, that is, the output voltage ratio is low, these samples generate tolerably larger outputs in the main sensitivity axis direction which is for detection of acceleration than in a direction perpendicular to the main sensitivity axis direction. Hitherto, those samples #69 and #75 generate little error. And, referring the result in FIG. 26, sample #69 and #75 generate the largest output in the main sensitivity axis direction compared with other samples and the output characteristic is substantially constant and stable.

Figure 27A:
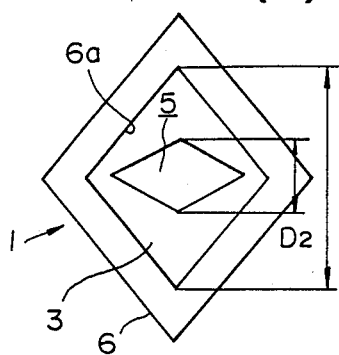
FIGS. 27 (A) and (B) are a plan view and an axial cross-sectional view of a sixteenth embodiment of the present invention, respectively.
Figure 27B:
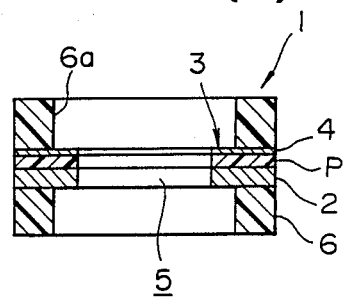

FIGS. 27 (A) (B) and 28 illustrate a sensing unit 1 according to one embodiment of the present invention. The sensing unit 1 has the same structure as the unit in Example 12 in FIGS. 23 (A) (B) except as follows, i.e., laminate R is rhombic-plate-shape; a diaphragm or an oscillation plate 2, a piezo-electric element P, and an electrode 4 are rhombic-plate-shaped; a through-hole 5 is rhombic or rectangular; and a fixing frame is a rhombic ring. The through-hole 5 is shaped in the manner that its longer diagonal agree with the shorter diagonal of the fixing frame 6. In this sensing unit 1, $0.2 \leq D_2/D_1 \leq 0.8$ where $D_1$ is the length of the longer diagonal of the fixing frame 6 and $D_2$ is the length of the shorter diagonal of the through-hole 5.

EXAMPLE 14

Figure 28:
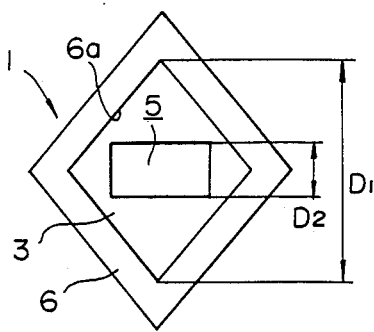
FIG. 28 is a plan view of a seventeenth embodiment of the present invention.

Samples #76 to #84 of piezo-electric acceleration sensors having structures shown in FIGS. 27 and 28 and similar structure were prepared under the same conditions and manners as samples of Example 13.

In the following description, if the through-hole is rectangular, the difference of angle between a direction agreeing to the maximum breaking strength and the direction of the shorter side is determined as $\theta$. Similarly, if the through-hole is rhombic, the difference of angle between a direction agreeing to the maximum breaking strength and the direction of the shorter diagonal is determined as $\theta$. And, the difference of angle between a direction agreeing to the maximum breaking strength and the direction of the longer diagonal of the frame is determined as $\phi$.

(1) Sample #76 in FIG. 27

Figure of the through-hole: rhombic (8 mm major axis, 6 mm minor axis) $\theta=0°$. $\phi=0°$.

(2) Sample #77 in FIG. 28

Figure of the through-hole: rectangular (6 mm longer side, 4 mm shorter side) $\theta=0°$. $\phi=0°$.

(3) Sample #78

Through-hole: none $\phi=0°$ (4) Sample #79

Through-hole: none $\phi=90°$ (5) Sample #80

Figure of the through-hole: rectangular(9.8 mm longer side $\times$ 1.5 mm shorter side) $\theta=0°$. $\phi=0°$ (6) Sample #81

Figure of the through-hole: rhombic (10 mm major axis $\times$ 6 mm minor axis) $\theta=0°$. $\phi=0°$.

Figure of the through-hole: rectangular(6 mm longer side $\times$ 2 mm shorter side) $\theta=0°$. $\phi=0°$.

(8) Sample #83

Figure of the through-hole: rectangular(6 mm longer side $\times$ 4 mm shorter side) $\theta=45°$. $\phi=0°$.

Next, samples #76 to #83 were tested, that is, the output voltage from the samples was measured changing the sinusoidal oscillation acceleration in the area from 2 Hz to 500 Hz. FIG. 26 illustrates the result of this test.

Referring to the result in Table 9, samples #76 and #77 have a characteristic, that is, the output voltage ratio is low. These samples generate a tolerably larger output in the main sensitivity direction which is used for detection of acceleration than in a direction perpendicular to the main sensitivity axis direction. Hitherto, these samples #76 and #77 generate the little error. And, referring to the result in FIG. 29, samples #76 and #77 generates largest output in the main sensitivity axis direction compared with other samples and the output characteristic is substantially constant and stable.

Figure 30A:
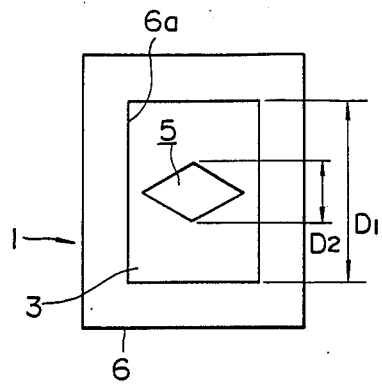
FIGS. 30 (A) and (B) are a plan view and an axial cross-sectional view of an eighteenth embodiment of the present invention, respectively.

FIGS. 30(A) (B) and 31 illustrate a sensing unit. A modified form of the sensor unit 1 of FIG. 21 is illustrated in FIGS. 30(A) and (B), in which all the members thereof, that is, diaphragm 2, piezo-electric element 3, electrode 4 and fixing frames 6, 6 are rectangular. In this sensor unit, the longer side D1 and the shorter side D2 are determined to follow the equation about $0.2 \leq D2/D1 \leq$ about 0.8. When the breaking strength of the piezo-electric element P depends on the direction, the element P is fixed between the frames 6 and 6 so that the maximum breaking strength direction thereof is placed along the direction of the longer side D1 within an angle 10° formed between them.

Figure 31:
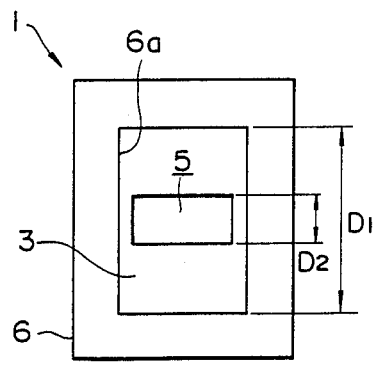
FIG. 31 is a plan view of a nineteenth embodiment of the present invention.

FIG. 31 illustrates a modified form of the sensor unit in FIG. 20, and this modified form is distinct in that all the members thereof are rectangular.

EXAMPLE 15

Figure 30B:
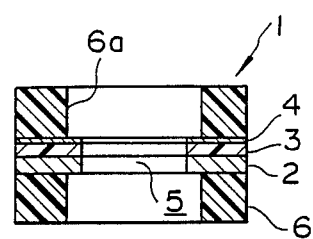

Samples #85-93 were prepared and tested as to the directivity output (Vo/V) $\times$ 100% in the same condition as in Example 10. Each sample had a 9 $\mu$m PVDF biaxially oriented film piezo-electric element, a 5 micron nickel layer diaphragm electroplated over the piezo-electric element, and a pair of fixing frames sandwiching the laminate and having a 12 mm $\times$ 10 mm rectangular through-hole 6a. Other specifications of the samples are as follows: sample #85 had the structure of FIG. 30 with a rhombus having a 8 mm longer diagonal and a 6 mm shorter diagonal, angle $\theta=0$ degrees and $\phi=0$ degrees, where $\phi$ is an angle contained between the maximum breaking strength direction of the piezo-electric element and the longer side direction of the rectangular hole 6a; the sample #86 had the structure of FIG. 31 with a 6 mm $\times$ 4 mm rectangular hole, angle $\theta=0$ degrees and $\phi=0$ degrees; sample #87 was blind and $\phi=90$ degrees; sample #88 was blind and $\phi=90$ degrees; sample #89 was the same as sample 86 except for a 10 mm longer side; sample #90 was the same as sample #85 except for a 10 mm longer diagonal; sample #91 was the same as sample #86 except for a 2 mm shorter side; sample #92 was the same as sample #86 except for angle $\theta=45$ degrees; and sample #93 had ring-shaped fixing frames with inner diameter 10 mm and the laminate had no hole 5. The results of the test are given in Table 10.

TABLE 10

| | Directivity Output | | | | |
| --- | --- | --- | --- | --- | --- |
| Sample # | 85 | 86 | 87 | 88 | 89 |
| (Vo/V) $\times$ 100(%) | 5 ± 1 | 4 ± 2 | 23 ± 5 | 31 ± 6 | 15 ± 5 |
| Sample # | 90 | 91 | 92 | 93 | |
| (Vo/V) $\times$ 100(%) | 18 ± 5 | 18 ± 6 | 17 ± 5 | 10 ± 2 | |

Figure 32:
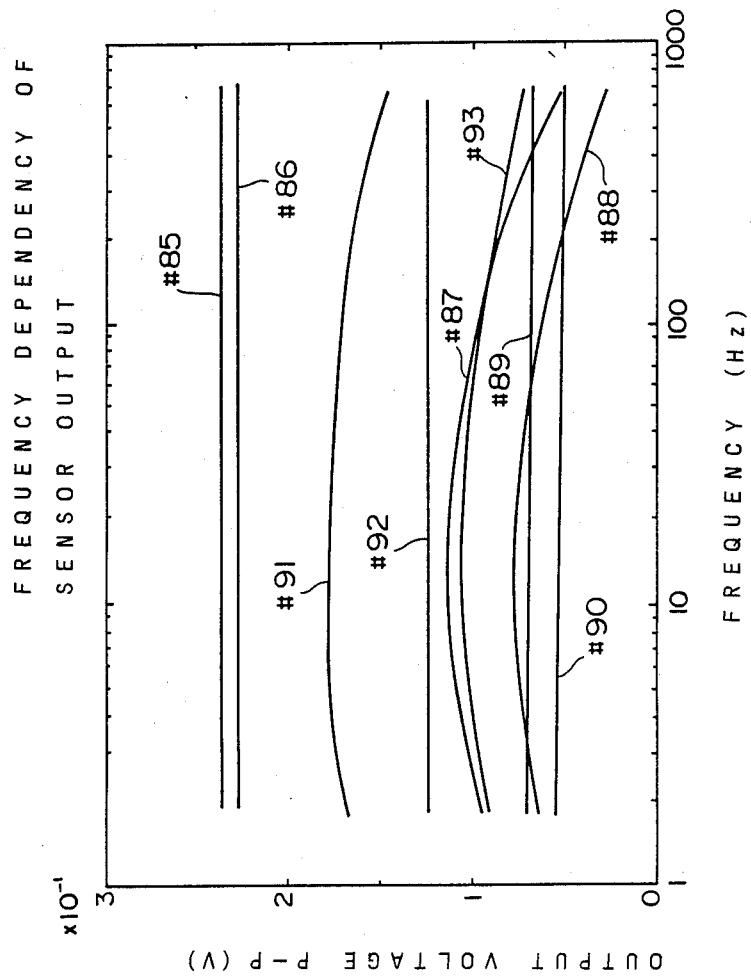
FIG. 32 is a graph showing frequency characteristics of each sensor in Example 15.

The output voltage of each sample was measured by applying sinusoidal oscillation acceleration with frequency of 2 Hz to 500 Hz. The results are plotted in FIG. 32. From these tests it was noted that samples #85 and 86 exhibited excellent performance in both directivity output and frequency characteristics.

Figure 33A:
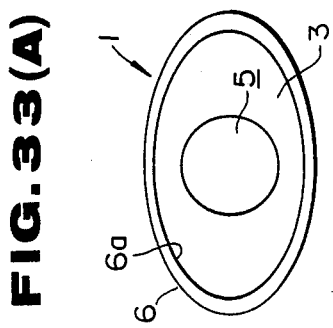
FIGS. 33 (A) and (B) are a plan view and an enlarged axial cross-sectional view of a twentieth embodiment of the present invention, respectively.
Figure 33B:
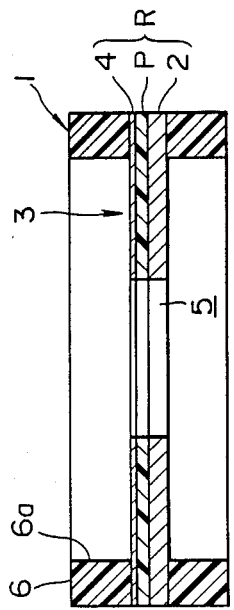

FIGS. 33A and 33B show essential parts of piezo-electric acceleration sensors, and parts of a detection portion 1 corresponding to Embodiment 20. As shown in FIGS. 33A and 33B, the detection portion 1 of the piezo-electric acceleration sensor in Embodiment 20 comprises, in the form of an integrated laminate, an oscillation plate 2 formed into an elliptical plate, a film-like high polymeric piezo-electric element P adhered by adhesives to the surface of the oscillation plate 2 and an electrode 4 integrally mounted on the surface of the piezo-electric element P. The laminate is formed in its center with a round through-hole (a circular hole) 5, the laminate being supported within an elliptical hole (an oscillation hole) 6a in a stretched fashion in such a manner that a peripheral edge portion (a fixing frame) 6 sandwich the laminate.

The oscillation plate 2, whose portion not in contact with the fixing portion 6 oscillates, is formed, for example, of a nickel foil having a thickness of 5 $\mu$m, and has a "deformation rigidity" enough to withstand the piezo-electric device 3. The oscillation plate 2 is set so as to have a relationship as follows:

$(E_B \times T_B^3)/(E_P \times T_P^3) \geq 5$ between the elastic modulus $E_B$ and thickness $T_B$ of the oscillation plate 2 and the elastic modulus $E_P$ and thickness $T_P$ of the piezo-electric device 3.

The piezo-electric element P is formed from a high polymeric piezo-electric element, for example, a 9 $\mu$m thick polyvinylidene fluoride oriented film, and formed into a shape substantially similar to that of the oscillation plate 2.

The electrode 4 is constructed in such a manner that metallic conductors are respectively integrally coated on both surfaces of the piezo-electric element P (one surface of which is omitted since in the example shown in FIG. 33, the oscillation plate 2 is formed of a conductive material such as a nickel foil) by a film-forming method such as vapor deposition.

EXAMPLE 16

Sample 94 to 104 of piezo-electric acceleration sensors, having structures shown in FIG. 33 and similar structures, were prepared, and the ratio of output voltage Vs over output voltage Vm was determined when the shape of the fixing frame, the direction of the maximum breaking strength of the piezo-electric device, and the shape of the circular hole were varied, where the output voltage Vm was given by applying acceleration oscillation to each sample in the main sensitive axis, i.e., the thicknesswise direction of the piezo-electric acceleration; and the output voltage Vm was given by applying acceleration oscillation to it in a direction perpendicular to the main sensitivity axis direction, i.e., in parallel with the plane of the piezo-electric device. The output voltages were detected by applying 200 Hz and 1 G sinusoidal oscillation acceleration.

(1) Sample 94

A laminate, which comprises a 9 μm thick piezo-electric polyvinylidene fluoride oriented film as a high polymeric piezo-electric element and a 10 mm thick nickel foil as an oscillation plate, was held in a fixing frame having a 12 mm outside diameter and 10 mm inside diameter to form a detection portion. The detection portion was bored in its central portion with a circular hole by a laser trimmer, the circular hole being set so that the ratio of area of the film portion was 80% of an area of the frame.

(2) Sample 95

By use of a fixing frame in the form of an elliptical hole having the same inner area as that of the sample 94, a circular hole was bored in the central portion of a film portion to prepare a detection portion whose ratio of area is 80%. The ratio of the minor axis to the long diameter of the elliptical hole was set to 2:3, and the angle formed between the direction of the minor axis and the direction of the maximum breaking strength of the piezo-electric element was set to 20 degrees.

(3) Sample 96

The same piezo-electric element and oscillation plate as those of Sample 94 were used. The ratio of the minor axis and the major axis of the elliptical hole was set to 2:3, and the angle formed between the direction of the short diameter and the direction of the maximum breaking strength of the piezo-electric element was set to 40 degrees.

(4) Sample 97

The angle formed between the direction of the minor axis of the elliptical hole and the direction of the maximum breaking strength of the piezo-electric element was set to 5 degrees. A circular hole wherein an area of a film portion is 90% of an area of the elliptical hole was made. Other conditions were set similarly to the Sample 95.

(5) Sample 98

Among the conditions of Sample 97, the ratio of area of the film portion was set to 95%.

(6) Sample 99

Among the conditions of Sample 98, the ratio of area of the film portion was set to 15%.

(7) Sample 100

Among the conditions of Sample 94, a circular hole and an elliptical hole were used. The ratio of the minor axis to the major axis of the elliptical hole was set to 2:3, the angle formed between the direction of the minor axis and the direction of the maximum breaking strength of the piezo-electric element set to 5 degrees, and the ratio of area set to 20%.

(8) Sample 101

A circular hole wherein the ratio of area of the film portion is 50% was used, and other conditions were set similarly to those of Sample 100.

(9) Sample 102

A circular hole wherein the ratio of area of the film portion is 80% was used, and other conditions were set similarly to those of Sample 100.

(10) Sample 103

The angle formed between the direction of the minor axis of the elliptical hole and the direction of the maximum breaking strength of the piezo-electric element was set to 7 degrees, and other conditions were set similarly to those of Sample 100.

(11) Sample 104

The ratio of the minor axis to the major axis of the elliptical hole was set to 3:5, and other conditions were set similarly to those of Sample 100.

The results of comparison is given in Table 11.

TABLE 11

| Sample No. | 94 | 95 | 96 | 97 | 98 | 99 |
|---|---|---|---|---|---|---|
| Ratio of output voltage | 1 | 1.5 | 1.3 | 2.7 | 1.2 | 0.8 |
| Ratio of sensitivity between longitudinal and lateral portions | 10 | 9 | 9 | 10 | 10 | 8 |

| Sample No. | 100 | 101 | 102 | 103 | 104 |
|---|---|---|---|---|---|
| Ratio of output voltage | 3 | 3.3 | 3.5 | 2.8 | 3.2 |
| Ratio of sensitivity between longitudinal and lateral portions | 9 | 8 | 9 | 9 | 9 |

In the above table, the ratio of output voltage represents the value per 1G with respect to 1 in Sample 94, and the ratio of sensitivity between longitudinal and lateral portion is %.

It has been confirmed from these results that if Sample 97 and Sample 100 to 104 are satisfied with the following conditions:

i. The piezo-electric device formed with a circular hole in the central portion thereof is oscillated within the elliptic hole, ii. The area of the circular hole is in the range of 10 to 80% of the area of the elliptical hole, and iii. The angle formed between the direction of the short diameter of the elliptical hole and the direction of the maximum breaking strength of the piezo-electric element is less than 7 degrees (which is less than 10 degrees if an assumption is made so that the ratio of output voltage is allowed up to the range of 2.5 times), then the ratio of output voltage considerably increases (output 2.5 times of that of Sample 94) without lowering the ratio of sensitivity between longitudinal and lateral portions).

Figure 34A:
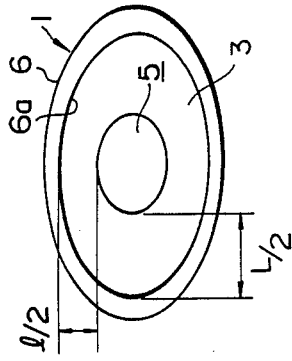
FIGS. 34 (A) and (B) are a plan view and an enlarged axial cross-sectional view of a twenty-first embodiment of the present invention, respectively.
Figure 34B:
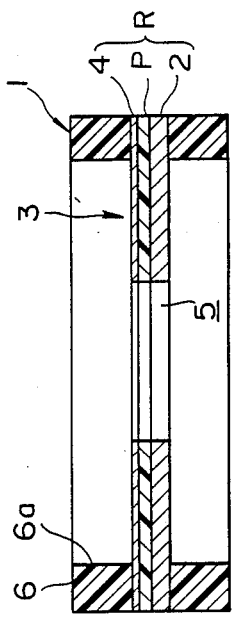

FIGS. 34A and 34B show essential parts of piezo-electric acceleration sensors and parts of a detection portion 1 corresponding to Embodiment 21.

As show in FIGS. 34A and 34B, the detection portion 1 of the piezo-electric acceleration sensor in Embodiment 21 comprises, in the form of an integrated laminate, an oscillation plate 2 formed into an elliptical plate, a film-like high polymeric piezo-electric element P adhered by adhesives to the surface of the oscillation plate 2 and an electrode 4 integrally mounted on the surface of the piezo-electric element P. The laminate R is formed in its center portion with a through-hole (an elliptical hole) 5, the laminate R being supported within an elliptical hole 6a in a stretched fashion in such a manner that peripheral edge portion thereof is held by an elliptical fixing portion (a fixing frame) 6.

The oscillation plate 2, whose portion not in contact with the fixing portion 6 oscillates, is formed, for example, of a nickel foil having a thickness of 10 μm, and has a "deformation rigidity" enough to withstand the piezo-electric device 3. The oscillation plate 2 is set so as to have a relationship as follows:

$$(E_B \times T_B^3)/(E_P \times T_P^3) \geqq 5$$

between the elastic modulus $E_B$ and thickness $T_B$ of the oscillation plate 2 and the elastic modulus $E_P$ and thickness $T_P$ of the piezo-electric device 3.

The piezo-electric element P is formed from a high polymer piezo-electric element, for example, a 9 μm thick polyvinylidene fluoride oriented film, and formed into a shape substantially similar to that of the oscillation plate 3.

The electrode 4 is constructed in such a manner that metallic conductors are respectively integrally coated on both surfaces of the piezo-electric element P (one surface of the example shown in FIG. 34 the oscillation plate 2 is formed of a conductive material such as nickel foil) by a film-forming method such as vapor deposition.

EXAMPLE 17

Sample 105 to 116 of piezo-electric acceleration sensors, having structures shown in FIG. 34 and similar structures, were prepared, and the ratio of output voltage Vs over output voltage Vm was determined when the shape of the fixing frame, the direction of the maximum breaking strength of the piezo-electric device, and shape of the circular hole were varied, where the output voltage Vm was given by applying an acceleration oscillation to each sample in the main sensitivity axis, i.e., the thicknesswise direction of the piezo-electric acceleration; and the output voltage Vs was given by applying an acceleration oscillation to it in a direction perpendicular to the main sensitivity axis direction, i.e., in parallel with the plane of the piezo-electric device. The output voltages were detected by applying 200 Hz and 1 G sinusoidal oscillation acceleration.

(1) Sample 105

Sample 105 was prepared in a manner similar to that of Sample 94 previously described.

(2) Sample 106

A piezo-electric film formed in its center portion with an elliptical hole and an elliptical fixing frame were used to constitute a detection portion so that an area of a film (piezo-electric device) portion is the same as that of Sample 105. The ratio of the minor axis to the major axis of the elliptical hole was set to 2:3, an area of the elliptical hole was set to 20% of the elliptical hole, and the angle formed between the direction of the major axis of the elliptical hole and the direction of the maximum breaking strength of the piezo-electric element was set to 20 degrees.

(3) Sample 107

The same conditions as those of Sample 106 were used except that the angle formed between the direction of the major axis of the piezo-electric element and the direction of the maximum breaking strength of the piezo-electric device was set to 40 degrees.

(4) Sample 108

The angle formed between the direction of the major axis of the piezo-electric device and the direction of the maximum breaking strength of the piezo-electric element was set to 5 degrees, and the area of the elliptical bore was set to be 90% of that of the elliptical hole.

(5) Sample 109

The angle formed between the direction of the long diameter of the piezo-electric element and the direction of the maximum breaking strength of the piezo-electric element was set to 5 degrees, and the area of the elliptical bore was set to be 10% of that of the elliptical hole.

(6) Sample 110

Under the conditions of Sample 109, the area of the elliptical bore was set to be 50% of that of the elliptical hole.

(7) Sample 111

The angle formed between the direction of the long diameter of the piezo-electric element and the direction of the maximum breaking strength of the piezo-electric element was set to 5 degrees, the area of the elliptical bore was set to 20% of that of the elliptical hole, and the dimension in FIG. 34 was set to L<1.

(8) Sample 112

The same film as Sample 105 was used to prepare a detection portion. The ratio of the long diameter to the short diameter of the elliptical bore and elliptical hole was set to 3:2, the angle formed between the direction of the long diameter of the piezo-electric device and the direction of the maximum breaking strength of the piezo-electric device was set to 5 degrees, the area of the film portion was set to 80% of that of the elliptical hole, and the dimension in FIG. 34 was set to F<1.

(9) Sample 113

The same conditions as those 112 were used except that an elliptical bore wherein the ratio of area of the film portion is 50% was used.

(10) Sample 114

The same conditions as those of Sample 112 were used except that an elliptical bore wherein the ratio of area of the film portion is 20% was used.

(11) Sample 115

The angle formed between the direction of the major axis of the piezo-electric element and the direction of the maximum breaking strength of the piezo-electric element was set to 7 degrees, and for others, the same conditions as those of Sample 112 were used.

(12) Sample 116

The ratio of the major axis to the minor axis of the elliptical bore and elliptical hole was set to 5:3, and for others, the same conditions as those of Sample 112 were used.

The comparison results are given in Table 12.

TABLE 12

| Sample No. | 105 | 106 | 107 | 108 | 109 | 110 |
|---|---|---|---|---|---|---|
| Ratio of output voltage | 1 | 1.5 | 1.3 | 1.1 | 3.0 | 1.3 |
| Sample No. | 111 | 115 | 113 | 114 | 115 | 116 |

TABLE 12-continued

| Ratio of output voltage | 1.2 | 3.5 | 3.3 | 3.2 | 3.3 | 3.6 |
|---|---|---|---|---|---|---|

In the above table, the ratio of output voltage represents the value per 1G with respect to 1 in Sample 105.

It has been confirmed from these results that if Sample 109 and Sample 112 to 116 are satisfied with the following conditions:

i. The piezo-electric device formed with an elliptical bore in the central portion thereof is oscillated within the elliptical hole, ii. The area of the elliptical bore is in the range of 10 to 80% of the area of the elliptical hole, and iii. The angle formed between the direction of the long diameter of the elliptical hole and the direction of the maximum breaking strength of the piezo-electric element is less than 7 degrees (which is less than 10 degrees if an assumption is made so that the ratio of output voltage is allowed up to the range of 2.5 times), then the ratio of output voltage is considerably increased (output 2.5 times of that of Sample 105) without lowering the ratio of sensitivity between longitudinal and lateral portions).

Figure 35A:
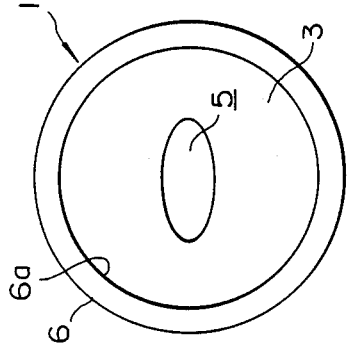
FIGS. 35 (A) and (B) are a plan view and an enlarged axial cross-sectional view of a twenty-second embodiment of the present invention, respectively.
Figure 35B:
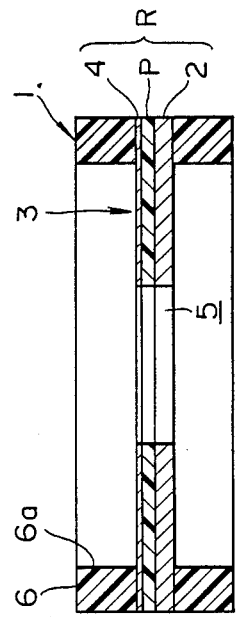

FIGS. 35A and 35B show essential parts of piezo-electric acceleration sensors, and parts of a detection portion 1 corresponding to Embodiment 22.

As shown in FIGS. 35A and 35B, the detection portion 1 of the piezo-electric acceleration sensor in Embodiment 22 comprises, in the form of an integrated laminate, an oscillation plate 2 formed into a disc, a film-like high polymeric piezo-electric element P adhered by adhesives to the surface of the oscillation plate 2 and an electrode 4 integrally mounted on the surface of the piezo-electric element P. The laminate R is formed in its center portion with a through-hole (an elliptical hole) 5, the laminate R being supported within a circular hole (an oscillation hole) 6a of the fixing portion in a stretched fashion in such a manner that a peripheral edge portion thereof is held by an annular fixing portion (a fixing frame) 6.

The oscillation plate 2, whose portion not in contact with the fixing portion 6 oscillates, is formed, for example, of a nickel foil having a thickness of 10 μm, and has a "deformation rigidity" enough to withstand the piezo-electric device 3. The oscillation plate 2 is set so as to have a relationship as follows:

$$(E_S \times T_B^3)/(E_P \times T_P^3) \geqq 5$$

between the elastic modulus $E_B$ and thickness $T_B$ of the oscillation plate 2 and the elastic modulus $E_P$ and thickness $T_P$ of the piezo-electric device 3.

The piezo-electric element P is formed from a high-polymeric piezo-electric element for example, a 9 μm thick polyvinylidene fluoride oriented film, and formed into a shape substantially similar to that of the oscillation plate 2.

The electrode 4 is constructed in such a manner that metallic conductors are respectively integrally coated on both surfaces of the piezo-electric element P (one surface of which is omitted since in the example shown in FIG. 35, the oscillation plate 2 is formed of a conductive material such as a nickel foil) by a film-forming method such as vapor deposition.

EXAMPLE 22

Samples 117 to 127 of piezo-electric acceleration sensors, having structures shown in FIG. 35 and similar structures, were prepared, and the ratio of output voltage Vs over output voltage Vm was determined when the shape of the fixing frame, the direction of the maximum breaking strength of the piezo-electric element, and the shape of the circular hole were varied, where the output voltage Vm was given by applying acceleration oscillation to each sample in the main sensitive axis, i.e., the thicknesswise direction of the piezo-electric acceleration; and the output voltage Vs was given by applying acceleration oscillation to it in a direction perpendicular to the main sensitivity axis direction, i.e, in parallel with the plane of the piezo-electric device. The output voltages were detected by applying 200 Hz and 1 G sinusoidal oscillation acceleration.

(1) Sample 117

Sample 117 was prepared in a manner similar to that of Sample 94 previously described.

(2) Sample 118

A detection portion of a piezo-electric element having an annular fixing portion having the same diameter of Sample 117 and an elliptical bore was prepared. An area of a film portion is the same as that of Sample 117. The ratio of the minor axis to the major axis of the elliptical bore was 2:3, and the angle formed between the direction of the minor axis and the direction of the maximum breaking strength of the piezo-electric device was set to 20 degrees.

(3) Sample 119

The angle formed between the direction of the minor axis of the elliptical bore formed in the piezo-electric device and the direction of the maximum breaking strength of the piezo-electric device was set to 40 degrees. Others are the same as Sample 118.

(4) Sample 120

The angle formed between the short diameter of the elliptical hole and the direction of the maximum breaking strength of the piezo-electric element was set to 5 degrees, and the area of the film portion was set to be 90% of that of the circular hole. Others are the same Sample 118.

(5) Sample 121

In Sample 120, an elliptical bore wherein an area of a film portion corresponds to 15% of the area of a circular hole was formed.

(6) Sample 122

In Sample 121, an area of a film portion was set to be 95% of that of a circular hole.

(7) Sample 123

The same film as that of Sample 117 was used to prepare a detection portion. However, the fixing portion was formed with a circular hole. The piezo-electric device was formed with an elliptical bore. The ratio of the major axis to the minor axis of the elliptical bore was set to 3:2. The angle formed between the direction of the maximum breaking strength of the piezo-electric device and the direction of the minor axis of the elliptical bore was set to 5 degrees, and the area of the film portion was 20% of the circular hole.

(8) Sample 124

An elliptical bore was made in the center so that the area of the film portion was 50% of the circular hole. For others, the same conditions as those of Sample 123 were used.

(9) Sample 125

An elliptical bore was made so that the ratio of area of the film portion was 80% of that of the circular hole. For others, the same conditions as those of Sample 123 were used.

(10) Sample 126

The angle formed between the direction of the maximum breaking strength of the piezo-electric device and the minor axis of the elliptical bore was set to 7 degrees. For others, the same conditions as those of Sample 123 were used.

(11) Sample 127

The ratio of the long diameter to the minor axis of the elliptical bore and the circular hole was set to 5:3. For others, the same conditions as those of Sample 123 were used.

The comparison results are given in Table 13.

TABLE 13A

| Sample No. | 117 | 118 | 119 | 120 | 121 | 122 |
|---|---|---|---|---|---|---|
| Ratio of output voltage | 1 | 1.3 | 1.1 | 3.0 | 0.8 | 1.2 |
| Sample No. | 123 | 124 | 125 | 126 | 127 | |
| Ratio of output voltage | 3.2 | 3.5 | 3.8 | 3.0 | 3.1 | |

In the above table, the ratio of output voltage represents the value per 1G with respect to 1 in Sample 117.

It has been confirmed from these results that if Sample 120, and Samples 123 to Sample 127, are satisfied with the following conditions:

i. The piezo-electric device formed with an elliptical bore in the central portion thereof is oscillated within the circular hole, ii. The area of the elliptical bore is in the range of 10 to 80% of the area of the circular hole, and iii. The angle formed between the direction of the minor axis of the elliptical bore and the direction of the maximum breaking strength of the piezo-electric device is less than 7 degrees (which is less than 10 degrees if an assumption is made so that the ratio of output voltage is allowed up to the range of 2.5 times), then the ratio of output voltage considerably increases (output 2.5 times of that of Sample 117) without lowering the ratio of sensitivity between longitudinal and lateral portions).

Figure 36A:
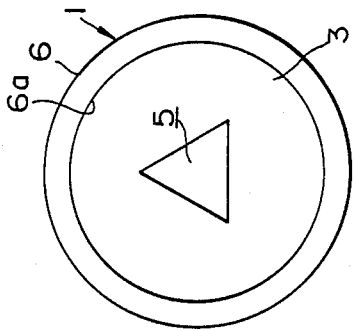
FIGS. 36 (A) and (B) are a plan view and an enlarged axial cross-sectional view of a twenty-third embodiment of the present invention, respectively.
Figure 36B:
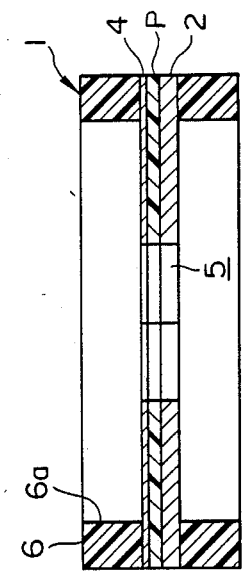

FIGS. 36A and 36B show essential parts of piezo-electric acceleration sensors, and parts of a detection portion 1 corresponding to Embodiment 23.

As shown in FIGS. 36A and 36B, the detection portion 1 of the piezo-electric acceleration sensor in Embodiment 23 comprises, in the form of an integrated laminate, an oscillation plate 2 formed into a disk, a film-like high polymeric piezo-electric element P adhered by adhesives to the surface of the oscillation plate 2 and an electrode 4 integrally mounted on the surface of the piezo-electric device. The laminate R is formed in its center portion with a through-hole (a triangular hole) 5 with which the center of gravity coincides, the laminate R being supported within a circular hole (an oscillation hole) 6a in a stretched fashion in such as manner that a peripheral edge portion thereof is held by an annular fixing portion (a fixing frame) 6.

The piezo-electric element P is formed from a high polymeric piezo-electric element for example, a 9 μm thick polyvinylidene fluoride oriented film, and formed into a shape substantially similar to that of the oscillation plate 3.

The electrode 4 is constructed in such a manner that metallic conductors are respectively integrally coated on both surfaces of the piezo-electric element P (one surface of which is omitted since in the example shown in FIG. 34, the oscillation plate 2 is formed of a conductive material such as a nickel foil) by a film-forming method such as vapor deposition.

EXAMPLE 23

Sample 128 to 134 of the piezo-electric acceleration sensors, having structures shown in FIG. 36 and similar structures, were prepared, and the direction of the maximum breaking strength of the piezo-electric device and the shape of the triangular hole were varied for comparison.

As the high polymeric piezo-electric film, a 9 μm thick piezo-electric polyvinylidene fluoride oriented film was used, and as the oscillation plate, a 5 μm thick nickel plated layer was formed on the piezo-electric film by electroplating. The laminate was held by an annular fixing portion having a 12 mm outside diameter and inside diameter of 10 mm to form a detection portion.

(1) Sample 128

A regular triangle hole whose one side has a length of 3.5 mm was made in the center of the laminate which is the oscillation portion. It was set so that an angle of 90 degrees was formed between the direction exhibiting the maximum breaking strength of the piezo-electric device and one side of the regular triangle hole.

(2) Sample 129

An isoscele hole whose base length is 6 mm, whose legs are 5 mm was made in the laminate. It was set so that an angle of 90 degrees was formed between the direction exhibiting the maximum breaking strength and one side of the equilateral triangle hole.

(3) Sample 130

A regular tria whose one-side length is 90 degrees was formed between the direction exhibiting the maximum breaking strength and one side of the regular triangle hole.

(4) Sample 131

A regular triangle hole of side 1.5 mm was made in the laminate. It was set so that an angle of 90 degrees was formed between the direction exhibiting the maximum breaking strength and one side of the regular triangle hole.

(5) Sample 132

A regular triangle hole whose one-side length is 3.5 mm was made in the laminate. It was set to so that an angle of 0 degrees was formed between the direction exhibiting the maximum breaking strength and one side of the triangle hole.

(6) Sample 133

A regular square hole whose one-side length is 2.3 mm was made in the laminate. It was set so that an angle of 90 degrees was formed between the direction of the maximum breaking strength and one side of the regular square hole.

(7) Sample 134

A laminate without being formed with a hole was prepared.

With respect to these samples, for the purpose of evaluating the directivity thereof, 200 Hz and 1G sinusoidal oscillation acceleration was applied to the main sensitive axis direction (thicknesswise direction of the piezo-electric device) and the direction of 90 degrees thereof to obtain the ratio of the output voltages:

{Vm (main sensitivity axis)/Vs (90 degrees of main sensitivity axis)}.

The comparison results are given in Table 13 (Unit: percentage).

TABLE 13B

| Sample No. | 128 | 129 | | | |
|---|---|---|---|---|---|
| Directivity (%) | 4 ± 1 | 5 ± 1 | | | |
| Sample No. | 130 | 131 | 132 | 133 | 134 |
| Directivity (%) | 15 ± 5 | 25 ± 7 | 23 ± 8 | 5 ± 1 | 12 ± 3 |

Figure 37:
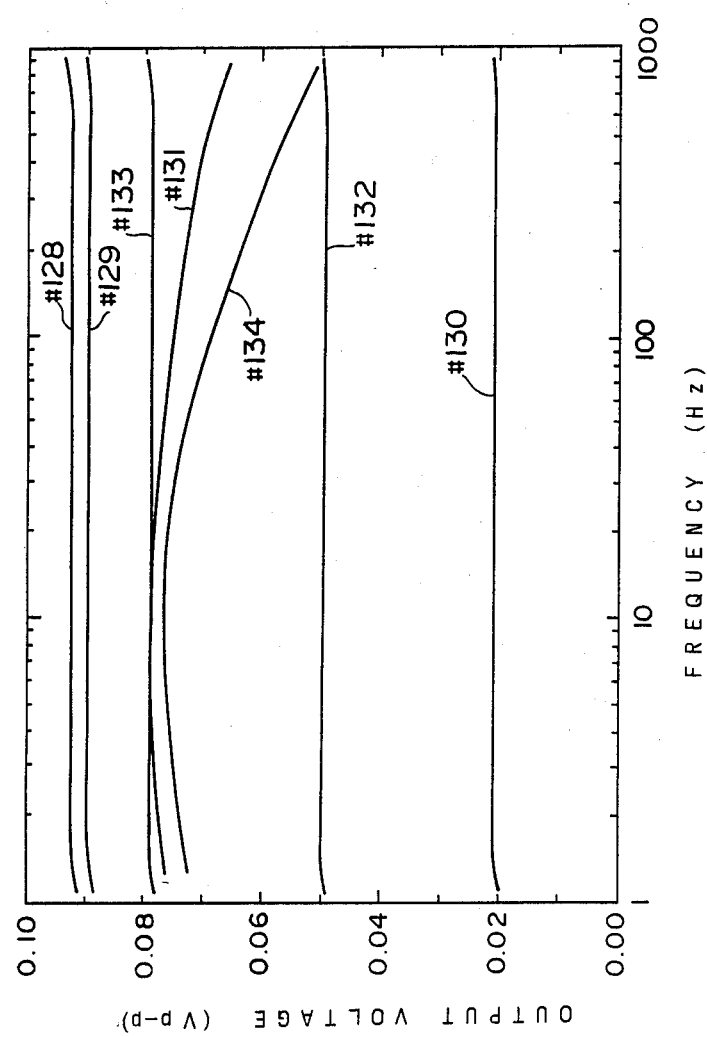
FIG. 37 is a graph showing frequency characteristics of each sensor in Example 23.

Subsequently, the 1G sinusoidal oscillation acceleration was applied to each of the samples with the frequencies varied from 2 Hz to 500 Hz to measure the output voltages. The output characteristics are given in FIG. 37.

It has been confirmed from these results that if Samples 128 and 129 are satisfied with the following conditions:

i. The piezo-electric device with a triangular hole in the central portion thereof is oscillated within the circular hole, ii. The triangular hole is an equilateral triangle or regular triangle. The length from each apex of the triangular hole to the center of gravity is in the range of 20 to 80% of the radius of the circular hole, and iii. The angle formed between the direction of the maximum breaking strength of the piezo-electric element and the perpendicular direction of one side of the triangular hole is within 10 degrees, then the output voltage is high, and the stable output characteristics may be obtained in a wide range of frequencies.

FIGS. 36A and 36B show essential parts of piezo-electric acceleration sensors, and parts of a detection potion 1 corresponding to Embodiment 23.

As shown in FIGS. 36A and 36B, the direction portion 1 of the piezo-electric acceleration sensor in Embodiment 23 comprises, in the form of an integrated laminate, an oscillation plate 2 formed into a disc, a film-like high polymeric piezo-electric element P adhered by adhesives to the surface of the oscillation plate 2, and an electrode 4 integrally mounted on the surface of the piezo-element. The laminate R is formed in its center portion with a through-hole (a triangular hole) 5 with which the center of gravity coincides, the laminate R being supported within a circular hole (an oscillation hole) 6a in a stretched fashion in such a manner that a peripheral edge portion thereof is held by an annular fixing portion (a fixing frame) 6.

The piezo-electric element P is formed from a high polymeric piezo-electric element, for example, a 9 mm thick polyvinylidene fluoride oriented film, and formed into a shape substantially similar to that of the oscillation plate 2.

The electrode 4 is constructed in such a manner that metallic conductors are respectively integrally coated on both surfaces of the piezo-electric element P (one surface of which is omitted since in the example shown in FIG. 36, the oscillation plate 2 is formed of a conductive material such as a nickel foil) by a film-forming method such as vapor deposition.

Figure 38A:
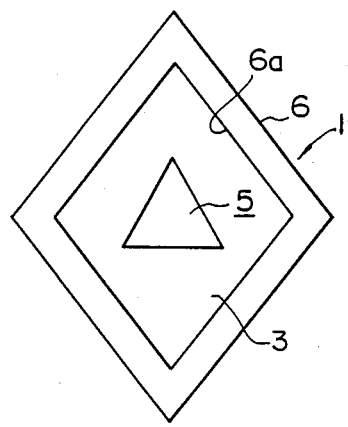
FIGS. 38 (A) and (B) are a plan view and an enlarged axial cross-sectional view of a twenty-fourth embodiment of the present invention, respectively.
Figure 38B:
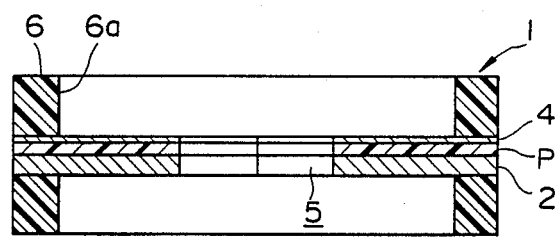

FIGS. 38A and 38B show essential parts of piezo-electric acceleration sensors, and parts of a detection portion 1 corresponding to Embodiment 24. As shown in FIGS. 38A and 38B, the detection portion 1 of the piezo-electric acceleration sensor in Embodiment 23 comprises, in the form of an integrated laminate, an oscillation plate 2 formed into a square film-like high polymeric piezo-electric element P adhered by adhesives to the surface of the oscillation plate 2 and an electrode 4 integrally mounted on the surface of the piezo-electric device. The laminate R is formed in its center portion with a through-hole (a triangular hole) 5 with which the center of gravity coincides, the laminate being supported within an oscillation hole (of rhombic shape) 6a in a stretched fashion in such a manner that a peripheral edge portion thereof is held by a rhombic fixing portion (a fixing frame) 6.

The piezo-electric element P is formed from a high polymeric piezoelectric element, for example, a 9 mm thick polyvinylidene fluoride oriented film, and formed into a shape substantially similar to that of the oscillation plate 2.

The electrode 4 is constructed in such a manner that metallic conductors are respectively integrally coated on both surfaces of the piezo-electric element P (one surface of which is omitted since in the example shown in FIG. 38, the oscillation plate 2 is formed of a conductive material such as nickel foil) by a film-forming method such as vapor deposition.

EXAMPLE 24

Samples 135 to 143 of piezo-electric acceleration sensors, having structures shown in FIG. 38 and similar structures, were prepared, and the direction of the maximum breaking strength of the piezo-electric element and the shape of the triangular hole were varied for comparison.

As the high polymeric piezo-elecltric film, a 9 μm thick piezo-electric polyvinylidene e fluoride oriented film was used, and as the oscillation plate, a 5 μm thick nickel-plated layer was formed on the piezo-electric film by electroplating. The laminate was supported within a rhombic hole of a fixing portion comprising a frame in a stretched fashion, and the diagonal lines of the diamond hole have the dimensions of a 12 mm longer one and a 9 mm shorter one.

(1) Sample 135

A regular triangle hole whose one side has a length of 3.5 mm was made in the center of the laminate which is the oscillation portion. It was set that an angle of 90 degrees was formed between the direction exhibiting the maximum breaking strength of the piezo-electric device and one side of the regular triangle hole, and, an angle of 90 degrees was formed between the direction exhibiting the maximum breaking strength and the shorter diagonal.

(2) Sample 136

An equilateral triangle hole whose base length is 6 mm and whose legs are 5 mm in length was made in the laminate. It was set so that an angle of 90 degrees was formed between the direction exhibiting the maximum breaking strength and one side of the equilateral triangle hole and an angle of 90 degrees was formed between the direction exhibiting the maximum breaking strength and the shorter diagonal.

(3) Sample 137

An equilateral triangular hole whose bottom-side length is 4 mm and median line length is 7.5 mm was formed into the laminate. It was set so that an angle of 90 degrees was formed between the direction exhibiting the maximum breaking strength and one side of the equilateral triangle hole and an angle of 90 degrees was formed between the direction exhibiting the maximum breaking strength and the shorter diagonal.

(4) Sample 138

A regular triangle hole whose side length is 1.5 mm was made. It was set so that an angle of 90 degrees was formed between the direction exhibiting the maximum breaking strength and one side of the regular triangle hole and an angle of 90 degrees was formed between the direction of the maximum breaking strength and the shorter diagonal.

(5) Sample 139

A regular angle hole whose side length is 3.5 mm was made. It was set so that an angle of 0 degree was formed between the direction exhibiting the maximum breaking strength and one side of the regular triangle hole and an angle of 90 degrees was formed between the direction of the maximum breaking strength and the shorter diagonal.

(6) Sample 140

A regular square hole whose side length is 2.3 mm was made in place of a triangular hole. It was set so that an angle of 90 degrees was formed between the direction exhibiting the maximum breaking strength and one side of the regular square hole, and an angle of 90 degrees was formed between the direction exhibiting the maximum breaking strength and the shorter diagonal.

(7) Sample 141

A regular triangle hole whose side length is 3.5 mm was made. It was set so that an angle of 90 degrees was formed between the direction exhibiting the maximum breaking strength and one side of the regular triangle hole and an angle of 0 degrees was formed between the direction exhibiting the maximum breaking strength and the shorter diagonal.

(8) Sample 142

A fixing portion was made in the form of a circular hole, and a laminate was not formed with a hole.

(9) Sample 143

A rhombic hole was made, and a laminate was formed without a hole. It was set so that an angle of 90 degrees was formed between the direction exhibiting the maximum breaking strength and the shorter diagonal.

With respect to these samples, for the purpose of evaluating the directivity thereof, 200 Hz and 1G sinusoidal oscillation acceleration was applied to the main sensitivity axis direction (thicknesswise direction of the piezo-electric device) and the direction of 90 degrees thereof to obtain the ratio of the output voltages:

{Vm (main sensitive axis)/Vs (90 degrees of main sensitive axis)}

The comparison results are given in Table 14 (Unit: percentage).

TABLE 14A

| Sample No. | 135 | 136 | 137 | 138 | 139 |
|---|---|---|---|---|---|
| Directivity (%) | 4 ± 2 | 5 ± 1 | 16 ± 5 | 12 ± 4 | 18 ± 4 |
| Sample No. | 140 | 141 | 142 | 143 | |
| Directivity (%) | 5 ± 1 | 15 ± 4 | 10 ± 4 | 13 ± 3 | |

Figure 39:
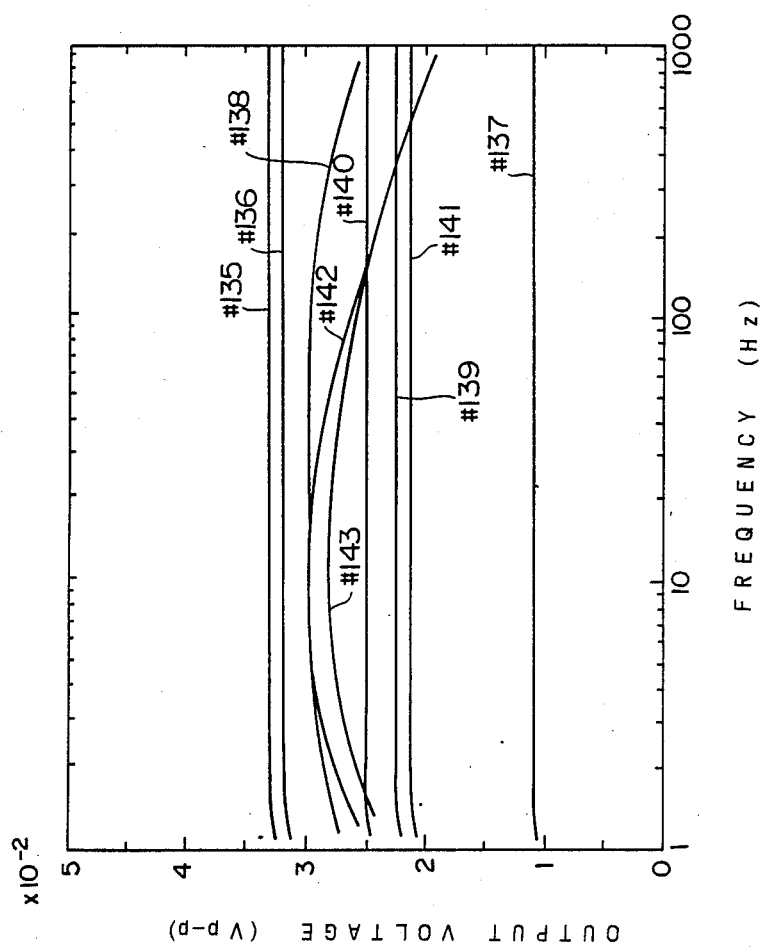
FIG. 39 is a graph showing frequency characteristics of each sensor in Example 24.

Subsequently, the 1G sinusoidal oscillation acceleration was applied to each of the samples with the frequencies varied from 2 Hz to 500 Hz to measure the output voltages. The output characteristics are given in FIG. 39.

It has been confirmed from these results that if Samples 135 and 136 are satisfied with the following conditions:

i. The piezo-electric device formed with a triangular hole in the central portion thereof is oscillated within the rhombic hole, ii. The direction of the maximum breaking strength substantially coincides with one of the diagonal lines of the rhombic hole, iii. The median line of the triangular hole substantially coincides with one of the diagonal lines of the rhombic hole, and iv. The length of the middle line of the triangular hole is in the range of 20 to 60% of the length of one of the diagonal lines of the rhombic hole, then the output voltage is extremely high, the frequency response characteristics are flat, and the output characteristics are stable over a wide range.

Figure 40A:
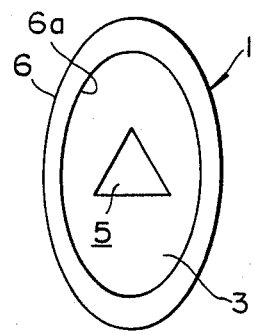
FIGS. 40 (A) and (B) are a plan view and an enlarged axial cross-sectional view of a twenty-fifth embodiment of the present invention, respectively.
Figure 40B:
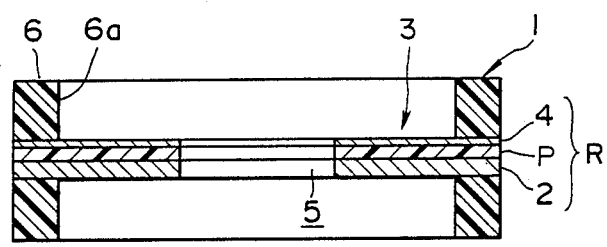

In the case where the triangular hole 5 is an equilateral triangle hole the middle line is used for the equilateral triangle. FIGS. 40A and 40B show essential parts of piezo-electric acceleration sensors, and parts of a detection portion 1 corresponding to Embodiment 25.

As shown in FIGS. 40A and 40B, the detection portion 1 of the piezo-electric acceleration sensor in Embodiment 25 comprises, in the form of an integrated laminate, an oscillation plate 2 formed into an ellipse film-like high polymeric piezo-electric element P adhered by adhesives to the surface of the oscillation plate 2 and an electrode 4 integrally mounted on the surface of the piezo-electric element. The laminate R is formed in its center portion with a through-hole (a triangular hole) 5 which coincides with the center of gravity the laminate R being supported within an elliptical hole 6a in a stretched fashion in such a manner that a peripheral edge portion thereof is held by an elliptical fixing portion (a fixing frame) 6 whereby a median line of the triangular hole 5 coincides with the direction of the major axis of the oscillation hole (elliptical hole) 6a.

The piezo-electric element P is formed from a high polymeric piezoelectric element, for example, a 9 mm thick polyvinylidene fluoride oriented film, and formed into a shape substantially similar to that of the oscillation plate 2.

The electrode 4 is constructed in such a manner that metallic conductors are respectively integrally coated on both surfaces of the piezo-electric element P (one surface of which is omitted since in the example shown in FIG. 40, the oscillation plate 2 is formed of a conductive material such as nickel foil) by a film-forming method such as vapor deposition.

EXAMPLE 25

Samples 144 to 152 of piezo-electric acceleration sensors, having structures shown in FIG. 40 and similar structures, were prepared, and the direction of the maximum breaking strength of the piezo-electric device and the shape of the triangular hole were varied for comparison.

As the high polymeric piezo-electric film, a 9 mm thick piezo-electric polyvinylidene fluoride oriented film was used, and as the oscillation plate, a 5 mm thick nickel-plated layer was formed on the piezo-electric film by electro-plating. The laminate was supported in a stretched fashion within the elliptical hole of the fixing portion comprising an elliptical frame, and the elliptical hole had the dimensions of a 12 mm major axis and a 9 mm minor axis.

(1) Sample 144

A regular triangle hole whose one side has a length of 3.5 mm was made in the center of the laminate which is the oscillation portion. It was set so that an angle of 90 degrees was formed between the direction exhibiting the maximum breaking strength of the piezo-electric device and one side of the regular triangle hole and an angle of 90 degrees was formed between the direction exhibiting the maximum breaking strength and the short diameter.

(2) Sample 145

An isosceles triangle hole whose bottom-side base length is 6 mm and whose legs are 5 mm was made in the laminate. It was set so that an angle of 90 degrees was formed between the direction exhibiting the maximum breaking strength and one side of the isosceles triangle hole and an angle of 90 degrees was formed between the direction exhibiting the maximum breaking strength and the minor axis.

(3) Sample 146

A regular triangle hole whose side length is 9 mm was made in the center of the laminate. It was set so that an angle of 90 degrees was formed between the direction exhibiting the maximum breaking strength and one side of the regular square hole, and an angle of 90 degrees was formed between the direction exhibiting the maximum breaking strength and the minor axis.

(4) Sample 147

A regular triangle hole whose side length is 1.5 mm was made. It was set so that an angle of 90 degrees was formed between the direction exhibiting the maximum breaking strength and one side of the regular triangle hole, and an angle of 90 degrees was formed between the direction exhibiting the maximum breaking strength and the minor axis.

(5) Sample 148

A regular triangle hole whose side length is 3.5 mm was made. It was set so that an angle of 0 degrees was formed between the direction exhibiting the maximum breaking strength and one side of the triangle hole, and an angle of 90 degrees was formed between the direction exhibiting the maximum breaking strength and the minor axis.

(6) Sample 149

A regular square hole whose side length is 2.3 mm was made in place of a triangular hole. It was set so that an angle of 90 degrees was formed between the direction exhibiting the maximum breaking strength and one side of the regular square hole, and an angle of 90 degrees was formed between the direction exhibiting the maximum breaking strength and the minor axis.

(7) Sample 150

A regular triangle hole whose side length is 3.5 mm was made. It was set so that an angle of 90 degrees was formed between the direction exhibiting the maximum breaking strength and one side of the regular triangle hole and an angle of 0 degrees was formed between the direction exhibiting the maximum breaking strength and the minor axis.

(8) Sample 151

In place of an elliptical hole, a circular hole having a 10 mm internal diameter was made to form a fixing portion, and a regular triangle hole whose side length is 3.5 mm was made. It was set so that an angle of 90 degrees was formed between the direction exhibiting the maximum breaking strength and one end of the regular triangle hole.

(9) Sample 152

An elliptical hole was made, and a laminate without a hole was prepared. It was set so that an angle of 90 degrees was formed between the direction of the maximum breaking strength and the minor axis.

With respect to these samples, for the purpose of evaluating the directivity thereof, 200 Hz and 1G sinusoidal oscillation acceleration was applied to the main sensitivity axis direction (thicknesswise direction of the piezo-electric device) and the direction of 90 degrees thereof to obtain the ratio of the output voltages:

{Vm (main sensitive axis )/ Vs(90 degrees of main sensitivity axis}

The comparison results are given in Table 14B (Unit: percentage).

TABLE 14B

| Sample No. | 144 | 145 | 146 | 147 | 148 |
|---|---|---|---|---|---|
| Directivity (%) | 3 ± 2 | 4 ± 2 | 18 ± 5 | 15 ± 4 | 20 ± 4 |
| Sample No. | 149 | 150 | 151 | 152 | |
| Directivity (%) | 6 ± 2 | 4 ± 1 | 4 ± 1 | 21 ± 4 | |

Figure 41:
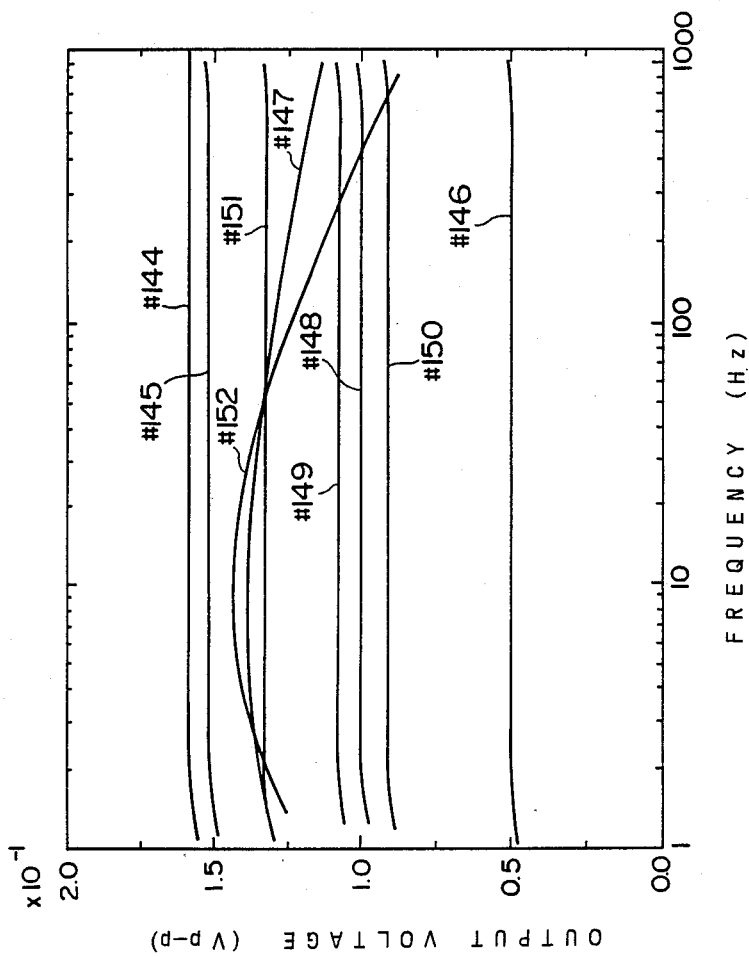
FIG. 41 is a graph showing frequency characteristics of each sensor in Example 25.

Subsequently, the 1G sinusoidal oscillation acceleration was applied to each of the samples with the frequencies varied from 2 Hz to 500 Hz to measure the output voltages. The output characteristics are given in FIG. 41.

It has been confirmed from these results that if Samples 144 and 145 are satisfied with the following conditions:

i. The piezo-electric device formed with a triangular hole in the central portion thereof is oscillated within the elliptical hole, ii. The distance of the triangular hole from the center of gravity to each apex is 20 to 80% of the distance from the center of gravity in the extending line thereof to the fixing portion, and iii. The direction of the maximum breaking strength is substantially perpendicular to the direction of one side of the triangular hole and the minor axis of the elliptical hole, then the output voltage is extremely high, the frequency response characteristics are flat, and the output characteristics are stable over a wide range.

A triangular hole preferably comprises an equilateral triangle hole. A middle line between the equilateral sides may coincide with a long diameter of an elliptical hole to thereby make a remarkable improvement in the characteristics of the invention.

FIGS. 42A and 42B show essential parts of piezo-electric acceleration sensors, and parts of a detection portion 1 corresponding to Embodiment 27.

As shown in FIGS. 42A and 42B, the detection portion 1 of the piezo-electric acceleration sensor in Embodiment 26 comprises, in the form of an integrated laminate, an oscillation plate 2 formed into a square film-like high polymeric piezo-electric element P adhered by adhesives to the surface of the oscillation plate 2 and an electrode 4 integrally mounted on the surface of the piezo-electric device. The laminate R is formed in its center portion with a through-hole (an elliptical hole) 5, the laminate R being formed in the center portion thereof with a through-hole (a circular hole) 5, the laminate R being supported within an oscillation hole (an equilateral square hole) 6a in a stretched fashion in such a manner that a peripheral edge portion thereof is held by a regular square fixing portion (a fixing frame) 6.

The oscillation plate 2, whose portion not in contact with fixing portion 6 oscillates, is formed, for example, of nickel foil having a thickness of 10 mm, and has a "deformation rigidity" enough to withstand the piezo-electric device 3. The oscillation plate 2 is set so as to have a relationship as follows:

$$(EB \times TB^3)/(Ep \times Tp^3) \geqq 5$$

between the elastic modulus EB and thickness TB of the oscillation plate 2 and the elastic modulus Ep and thickness Tp of the piezo-electric device 3.

The piezo-electric element P is formed of a high polymeric piezo-electric device, for example, a 9 mm thick polymeric fluoride oriented film, and formed into a shape substantially similar to that of the oscillation plate 2.

Figure 42:
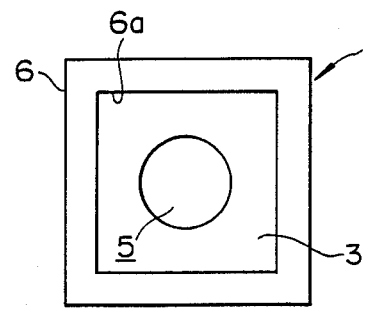
FIGS. 42 (A) and (B) are a plan view and an enlarged axial cross-sectional view of a twenty-sixth embodiment of the present invention, respectively.
Figure 42:
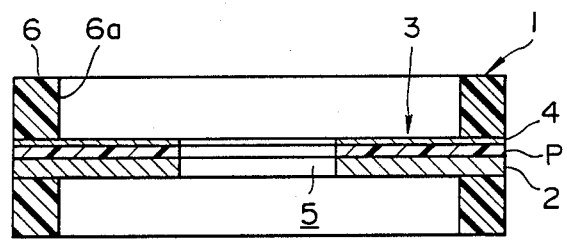

The electrode 4 is constructed in such a manner that metallic conductors are respectively integrally coated on both surfaces of the piezo-electric element P (one surface of which is omitted since in the example shown in FIG. 42, the oscillation plate 2 is formed of a conductive material such as nickel foil) by a film-forming method such as vapor deposition.

Figure 43:
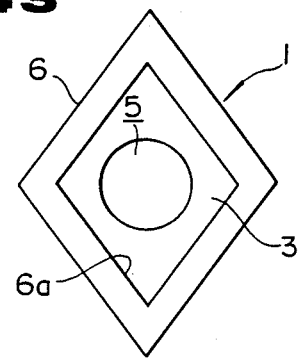
FIG. 43 is a plan view of a twenty-seventh embodiment of the present invention.

FIG. 43 shows the 27th embodiment in which the peripheral edge portion of the laminate is held by the diamond fixing portion (a fixing frame) 6 to thereby support it within the equilateral square hole 6a in a stretched fashion.

EXAMPLE 26

Sample 153 to 169 of piezo-electric acceleration sensors, having structures shown in FIGS. 42 and 43 and similar structures, were prepared, and the shape of the equilateral square hole, the area ratio of the circular holes, and the direction of the maximum breaking strength of the piezo-electric device, are varied for comparison. As the high polymeric piezo-electric film, a 9 μm thick piezo-electric polyvinylidene fluoride oriented film was used, and said film was cemented to a 10 μm thick nickel foil, which was then held by the fixing frame to form a detection portion.

The conditions applied to the samples hereinafter are represented by and in order of:
wherein an equilateral square hole of a fixing portion is rhombic
wherein an equilateral square hole is regular square
wherein a hole of a fixing portion is a round
% a proportion of an area except a circular hole of a film portion in a fixing frame, and an angle formed between the direction of the maximum length of diagonal lines of an equilateral square hole and the direction exhibiting the maximum breaking strength by the film.
Sample 153
A 80% circular hole is formed, by a laser trimmer, in the central portion of a round fixing frame having a 12 mm outside diameter and a 10 mm inside diameter
Sample 154
Same area as Sample 153, 80%, 20 degrees
Sample 155
Same area as Sample 153, 80%, 20 degrees
Sample 156
Same area as Sample 153, 80%, 40 degrees
Sample 157
Same area as Sample 153, 80%, 40 degrees
Sample 158
Same area as Sample 153, 90%, 40 degrees
Sample 159
Same area as Sample 153, 90%, 5 degrees
Sample 160
Same area as Sample 153, 90% , 5 degrees
Sample 161
Same area as Sample 153, 95%, 5 degrees
Sample 162
Same area as Sample 153, 15%, 5 degrees
Sample 163
Same area as Sample 153, 15% 5 degrees
Sample 164
Same area as Sample 153, 80%, 10 degrees
Sample 165
Same area as Sample 153, 80%, 10 degrees
Sample 166
Same area as Sample 153, 80%, 5 degrees
Sample 167
Same area as Sample 153, 80%, 5 degrees
Sample 168
Same area as Sample 153, 20%, 5 degrees
Sample 169
same area as Sample 153, 20%, 5 degrees
The comparison results are given in Table 15.

TABLE 15

| Sample No. | 153 | 154 | 155 | 156 | 157 | 158 | 159 |
|---|---|---|---|---|---|---|---|
| Output ratio | 1.0 | 1.3 | 1.2 | 1.2 | 1.3 | 3.0 | 1.3 |
| Sample No. | 160 | 161 | 162 | 163 | 164 | 165 | 166 |
| Output ratio | 3.1 | 1.2 | 1.2 | 1.1 | 3.5 | 3.3 | 3.8 |
| Sample No. | 167 | 168 | 169 | | | | |
| Output ratio | 3.5 | 3.4 | 3.2 | | | | |

Note that the output ratio represents the value per 1G when the output voltage in Sample 153 is 1.

It is apparent from these comparison results that the characteristics of Sample 174, and 177 to 180, are superior to those of other samples. That is, it has been confirmed that if the samples are satisfied with the following conditions:

i. the piezo-electric device formed in the central portion with a circular hole is oscillated within the square hole, ii. The area of the circular hole is in the range of 10 to 80% of the area of the regular square hole, and the device is oscillated within the hole, iii. The angle formed between the direction of the maximum breaking strength and the direction of the maximum inside diameter of the equilateral square hole is less than 10 degrees, then there is exhibited the high sensitivity characteristics in which the output voltage extremely increases.

FIGS. 44A and 44B show essential parts of piezo-electric acceleration sensors, and parts of a detection portion 1 corresponding to Embodiment 28.

As shown in FIGS. 44A and 44B, the direction portion 1 of the piezo-electric acceleration sensor in Embodiment 28 comprises, in the form of an integrated laminate, an oscillation plate 2 formed into a film-like square high polymeric piezo-electric element P adhered by adhesives to the surface of the oscillation plate 2 and an electrode 4 integrally mounted on the surface of the piezo-electric device. The laminate R is formed in its center portion with a through-hole (an elliptical hole) 5 with the long diameter adjusted to the direction parallel to one side of the regular square, the laminate R being supported within an oscillation hole (a square hole of a regular square) in a stretch fashion in such a manner that a peripheral edge portion thereof is held by a fixing portion (a fixing frame) 6 of the regular square.

The oscillation plate 2, whose portion not in contact with the fixing portion 6 oscillates, is formed, for example, of a nickel foil having a thickness of 10 mm, and has a "deformation rigidity" sufficient to withstand the piezo-electric device 3. The oscillation plate 2 is set so as to have a relationship as follows:

$$(EB \times TB^3)/(Ep \times Tp^3) \geq 5$$

between the elastic modulus EB and thickness TB of the oscillation plate 2 and the elastic modulus EP and thickness Tp of the piezo-electric device 3.

The piezo-electric element P is formed from a high polymeric piezo-electric element, for example, a 9 mm thick polyvinylidene fluoride oriented film, and is formed into a shape substantially similar to that of the oscillation plate 2 with the arrangement wherein the direction of the maximum breaking strength where the breaking strengths are different between longitudinal and lateral directions is brought into coincidence with the direction perpendicular to the direction of the long side of the square hole 6a.

The electrode 4 is constructed in such a manner that metallic conductors are respectively integrally coated on both surface of the piezo-electric element P (one surface of which is omitted, since in the example shown in FIG. 44, such as a nickel foil) by a film-forming method such as vapor deposition.

EXAMPLE 27

Samples 170 to 180 of piezo-electric acceleration sensors, having structures shown in FIG. 44 and similar structures, were prepared, and the shape of the square hole of the fixing portion, the area ratio of the elliptical hole, the direction of the maximum breaking strength of the piezo-electric device and the length of the film portion were varied to obtain an output voltage when the acceleration oscillation was applied in the direction of the main sensitivity axis (the thicknesswise direction of the piezo-electric device) for comparison. The output voltage were detected by applying 200 Hz and 1 G sinusoidal oscillation acceleration.

Sample 170

As the high polymeric piezo-electric film, a 9 mm thick piezo-electric polyvinylidene fluoride oriented film was used, and said film was cemented to a 10 mm thick nickel foil, which was then held by a round annular fixing frame having a 12 mm outside diameter and a 10 mm inside diameter to form a detection portion. The fixing frame is formed in the central portion thereof with a circular hole in which the film portion is 80% of the area of the fixing portion, by a laser trimmer.

Sample 171

The area of a film portion (except a hole of a laminate) is the same as Sample 170. A rectangular fixing portion (the ratio of short to long sides of the rectangular hole is 1:1.5). Let L be the length in the direction exhibiting the maximum breaking strength of the film portion surrounding the elliptical hole of the center portion and let 1 be the length of the film portion perpendicularly intersecting each other, then the relation of L ≧ 1 is established. The area of the elliptical hole in the center is 20% of the area of the regular square hole. The angle formed between the direction of the long side of the square hole, the direction of the short diameter of the elliptical hole and the direction exhibiting the maximum breaking strength by the film is 20 degrees.

Sample 172

The aforesaid angle is 40 degrees, and others are the same as Sample 171.

Sample 173

The angle is 5 degrees and the area of the elliptical hole is 90% of the square hole. Others are the same as Sample 171.

Sample 174

The angle is 5 degrees, and the area of the elliptical hole is 10%. Others are the same as Sample 171.

Sample 175

The area of the elliptical hole is 5%, and others are the same as Sample 171.

Sample 176

The angle is 5 degrees, and the area of the elliptical hole is 15%, L ≧ 1. Others are the same as Sample 171.

Sample 177

The angle is 5 degrees, and the area of the elliptical hole is 10%, L ≧ 1. Others are the same as Sample 171.

Sample 178

The area of the film portion is 50% of the square hole, and others are the same as Sample 171.

Sample 179

The are of the film portion is 80% of the square hole, and others are the same as Sample 171.

Sample 180

The angle is 7 degrees, and others are the same as Sample 177.

The comparison results are given in Table 16.

TABLE 16

| Sample No. | 170 | 171 | 172 | 173 | 174 | 175 |
|---|---|---|---|---|---|---|
| Ratio of output voltages | 1.0 | 1.7 | 1.4 | 1.1 | 3.0 | 1.3 |
| Sample No. | 176 | 177 | 178 | 179 | 180 | |
| Ratio of output voltages | 1.4 | 3.3 | 3.1 | 2.7 | 3.0 | |

It is noted that the output ratio represents the value per 1 G when the output voltage in Sample 170 is 1.

It is apparent from these results that the characteristics of Sample 174 and Samples 177 to 180 are superior to those of other samples, that is, it has been confirmed that if the samples are satisfied with the following conditions:

i. The piezo-electric device formed in the central portion with an elliptical hole is oscillated within the square hole, and the long diameter of the elliptical hole is parallel with the lengthwise direction of the square hole, ii. The area of the elliptical hole is in the range of 10 to 80% of the area of the regular square hole, and the device is oscillated with the hole, iii. the angle formed between the direction of the maximum breaking strength and the direction of the minor axis of the elliptical hole is less than 10 degrees, and iv. The length of the laminate portion in the direction of the maximum breaking strength is greater than the length of the laminate portion in the direction perpendicularly intersecting each other, then there exhibits the high sensitivity in which the output voltage extremely increases.

FIGS. 45A and 45B, show the essential parts of the piezo-electric acceleration sensors, and parts of a detection portion 1 corresponding to Embodiment 29.

As shown in FIGS. 45A and 45B, the detection portion 1 of the piezo-electric acceleration sensor in Embodiment 29 comprises, in the form of an integrated laminate, an oscillation plate 2 formed into a square film-like high polymeric piezo-electric element P adhered by adhesives to the surface of the oscillation plate 2 and an electrode 4 integrally mounted on the surface of the piezo-electric device. The laminate R is formed in its center portion (in the case of a rectangular hole, the point of intersection between the diagonal lines A and B) with a through-hole (a triangular hole) 5 which coincides with the center of gravity G, the laminate R being supported within a rectangular hole (an oscillation hole) 6a in a stretched fashion in such a manner that a peripheral edge portion thereof is held by a square fixing portion (a fixing frame) 6. In the case where the triangular hole 5 is an equilateral triangle, a middle line C at a right angle to the base is parallel with the long axis of the rectangular hole 6a.

The piezo-electric element P is formed from a high polymeric piezoelectric device, for example, a 9 mm thick polyvinylidene fluoride oriented film, and formed into a shape substantially similar to that of the oscillation plate 3.

The electrode 4 is constructed in such a manner that metallic conductors having a 5 mm thickness are respectively integrally coated on both surfaces of the piezo-electric element P (one surface of which is omitted since in the example shown in FIG. 45, the oscillation plate 2 is formed of a conductive material such as nickel foil) by a film-forming method such as vapor deposition.

EXAMPLE 28

Samples 181 to 189 of piezo-electric acceleration sensors, having structures shown in FIG. 45 and similar structures, were prepared, and the direction of the maximum breaking strength of the piezo-electric device and the shape of the triangular hole were varied for comparison.

As the high polymeric piezo-electric film, a 9 mm thick piezo-electric polyvinylidene fluoride oriented film was used, and as the oscillation plate, a 5 mm thick nickel plated layer was formed on the piezo-electric film by electro-plating. The laminate is supported in a stretched fashion within a rectangular hole of a fixing portion comprising a rectangular frame. The rectangular hole has the dimension of a 10 mm long axis and a 8 mm short axis.

(1) Sample 181

A regular triangle hole having a 20 mm length of one side is made in the center of a laminate which is an oscillation portion. It was set so that an angle of 90 degrees was formed between the direction exhibiting the maximum breaking strength of the piezo-electric device and one end of a regular triangle hole, and an angle of 90 degrees was formed between the direction exhibiting the maximum breaking angle and the short side.

(2) Sample 182

An equilateral triangle hole whose base length is 3 mm and middle-line length is 2.6 mm was made in a laminate. It was set so that an angle of 90 degrees was formed between the direction exhibiting the maximum breaking strength and one side of the equilateral triangle hole and an angle of 90 degrees was formed between the direction exhibiting the maximum breaking strength and the short side.

(3) Sample 183

A triangular hole comprises an equilateral triangle whose base length is 3.5 mm and middle-line length is 6 mm. It was set so that an angle of 90 degrees was formed between the direction exhibiting the maximum breaking strength and one side of the equilateral triangle hole, and an angle of 90 degrees was formed between the direction exhibiting the maximum breaking strength and base.

Sample 184

A regular triangle hole whose side length is 1 mm was made. It was set so that an angle of 90 degrees was formed between the direction exhibiting the maximum breaking strength and one side of the regular triangle hole, and an angle of 90 degrees was formed between the direction exhibiting the maximum breaking strength and the short side.

Sample 185

A regular triangle hole whose side length is 2 mm was made. It was set so that an angle of 0 degrees was formed between the direction exhibiting the maximum breaking strength and one side of the regular hole, and an angle of 90 degrees was formed between the direction exhibiting the maximum breaking strength and the short side.

Sample 186

A regular square hole whose side length is 2 mm was made in place of a triangular hole. It was set so that an angle of 90 degrees was formed between the direction of the triangle hole, and an angle of 90 degrees was formed between the direction exhibiting the maximum breaking strength and the short side.

Sample 187

A regular triangle hole whose one-side length is 2 mm was made. It was set so that an angle of 90 degrees was formed between the direction of the maximum breaking strength and one side of the regular triangle hole, and an angle of 0 degrees was formed between the direction exhibiting the maximum breaking strength and the short side.

Sample 188

A fixing portion was formed into a circular hole having a 10 mm inside diameter, and a laminate was prepared without a hole.

Sample 189

A square hole was prepared, and a laminate was prepared without a hole. It was set so that an angle of 90 degrees was formed between the direction exhibiting the maximum breaking strength and the short side.

With respect to these samples, for the purpose of evaluating the directivity thereof, 200 Hz and 1G sinusoidal oscillation acceleration was applied to the main sensitivity axis direction (thicknesswise direction of the piezo-electric device) and the direction of 90 degrees thereof to obtain the ratio of the output voltages:

{Vm (main sensitive axis)/Vs (90 degrees of main sensitivity axis}

The comparison results are given in Table 17. (Unit: percentage)

TABLE 17

| Sample No. | 181 | 182 | 183 | 184 | 185 |
|---|---|---|---|---|---|
| Directivity (%) | 4 ± 2 | 5 ± 1 | 15 ± 4 | 13 ± 3 | 20 ± 4 |

TABLE 17-continued

| Sample No. | 186 | 187 | 188 | 189 |
|---|---|---|---|---|
| Directivity (%) | 5 ± 1 | 12 ± 4 | 5 ± 3 | 12 ± 4 |

Figure 46:
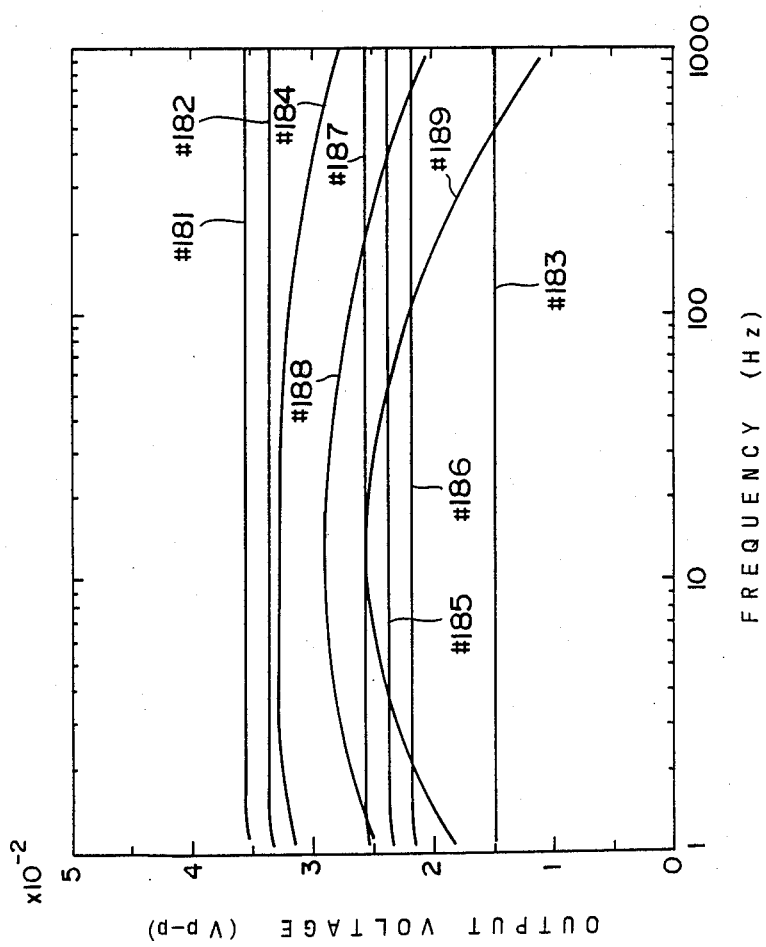
FIG. 46 is a graph showing frequency characteristics of each sensor in Example 28.

Subsequently, the 1 G sinusoidal oscillation acceleration was applied to each of the samples with the frequencies varied from 2 Hz to 500 Hz to measure the output voltages. The output characteristics are given in FIG. 46.

It has been confirmed from these results that if Samples 181 and 182 are satisfied with the following conditions:

i. The piezo-electric device formed with a triangular hole in the central portion thereof is oscillated within the square hole, ii. The median line of the triangle is parallel with the long side or the long diameter direction of the rectangular hole, iii. The direction of the maximum breaking strength substantially coincides with the long side or the long diameter of the rectangular hole, iv. The median line of the triangular hole substantially coincides with the direction of the maximum breaking strength, and v. The length of the middle line of the triangular hole is in the range of 20 to 60% of the length of the long side or long diameter of the rectangular hole, then the output voltage is extremely high, the frequency response characteristics are flat, and the output characteristics are stable over the wide range.

In the case where the triangular hole is an equilateral triangle hole, the middle line is used for the equilateral triangle.

Figure 47A:
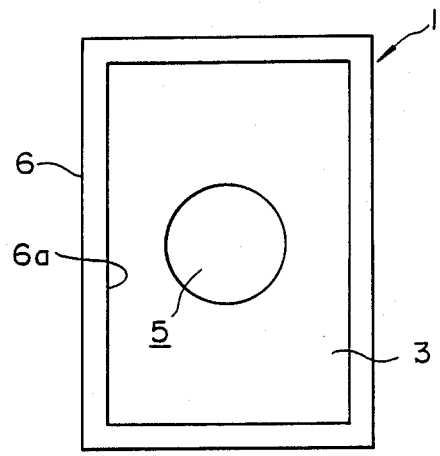
FIGS. 47 (A) and (B) are a plan view and an enlarged axial cross-sectional view of a thirtieth embodiment of the present invention, respectively.
Figure 47B:
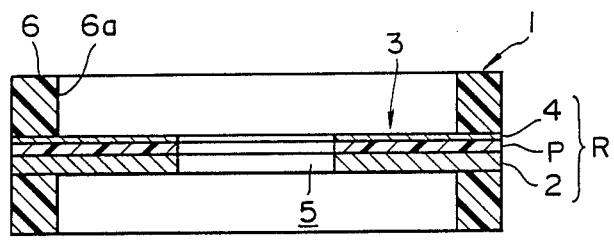

FIGS. 47A and 47B, show essential parts of piezo-electric acceleration sensors, and parts of a detection portion 1 corresponding to Embodiment 30.

As shown in FIGS. 47A and 47B, the detection portion 1 of the piezo-electric acceleration sensor in Embodiment 30 comprises, in the form of an integrated laminate, an oscillation plate 2 formed into rectangular film-like high polymeric piezo-electric element P adhered by adhesives to the surface of the oscillation plate 2 and an electrode 4 integrally mounted on the surface of the piezo-electric element. The laminate R is formed in its center portion with a through-hole (a circular hole) 5, the laminate R being supported within a rectangular hole (an oscillation hole) 6a in a stretched fashion in such a manner that a peripheral edge portion thereof is held by a rectangular fixing portion (a fixing frame) 6.

The oscillation plate 2, whose portion is not in contact with the fixing portion 6 oscillates, is formed, for example, of a nickel foil having a thickness of 10 mm, and has a "deformation rigidity" enough to withstand the piezo-electric device 3. The oscillation plate 2 is set so as to have a relationship as follows:

$$(E_B \times T_B^3)/(E_p \times T_p^3) \geq 5$$

between the elastic modulus $E_B$ and thickness $T_B$ of the oscillation plate 2 and the elastic modulus $E_p$ and thickness $T_p$ of the piezo-electric device 3.

The piezo-electric element P is formed from a high polymeric device, for example, a 9 μm thick polyvinylidene fluoride oriented film, and formed into a shape substantially similar to that of the oscillation plate 2.

The arrangement in which the breaking strength is different between the longitudinal and lateral portions, the direction of the maximum breaking strength coincides with the lengthwise direction.

The electrode 4 is constructed in such a manner that metallic conductors are respectively integrally coated on both surfaces of the piezo-electric element P (one surface of which is omitted since in the example shown in FIG. 47, the oscillation plate 2 is formed of a conductive material such as a nickel foil) by a film-forming method such as vapor deposition.

EXAMPLE 29

In samples 190 to 200 of the piezo-electric acceleration sensors, having structures shown in FIG. 47 and similar structures, were prepared, and the output voltage was obtained when the shape of the hole of the fixing portion, the area ratio of the circular hole, and the direction of the maximum breaking strength of the piezo-electric device were varied, where the output voltage was given by applying acceleration oscillation to each sample in the main sensitivity axis, i.e., the thicknesswise direction of the piezo-electric acceleration. The output voltages were detected by applying 200 Hz and 1 G sinusoidal oscillation acceleration.

Sample 190

A 9 μm thick piezo-electric polyvinylidene fluoride oriented film was used as a high polymeric piezo-electric device, and an element obtained by cementing it to a 10 μm nickel foil is held by a round annular fixing frame whose outside diameter is 12 mm and inside diameter is 10 mm to form a detection portion. A 80% circular hole was formed in the central portion of the fixing frame.

Sample 191

A hole of a fixing portion is a rectangle in the ratio of short side to long side=1:1.5. The area of the rectangular hole is the same as Sample 190. An angle of 20 degrees was formed between the direction of the maximum length of the diagonal lines in the rectangular hole and the direction exhibiting the maximum breaking strength by the film. A circular hole was made so that an area of the film portion is 80%.

Sample 192

The above-described angle is 40 degrees. Others are the same as Sample 191.

Sample 193

The angle is 5 degrees. The area of the film portion is 90%. Others are the same as Sample 191.

Sample 194

The area of the film portion is 90%. Others are the same as Sample 193.

Sample 195

The angle is 5 degrees. The area of the film is 15%. Others are the same as Sample 191.

Sample 196

In Sample 191, the angle is 5 degrees.

Sample 197

In sample 191, the angle is 7 degrees.

Sample 198

In sample 196, the area of the film portion is set to be 70% of the rectangular hole.

Sample 199

In Sample 196, the area was set to 50%.

Sample 200

In Sample 196 the area was set to 20%.

The comparison results are given in Table 18.

TABLE 18

| Sample No. | 190 | 191 | 192 | 193 | 194 | 195 |
|---|---|---|---|---|---|---|
| Ratio of output voltage | 1.0 | 1.5 | 1.2 | 3.0 | 1.3 | 1.2 |
| Sample No. | 196 | 197 | 198 | 199 | 200 | |
| Ratio of output voltage | 3.5 | 3.3 | 3.4 | 3.2 | 3.0 | |

The output ratio represents the value per 1 G when the output voltage in Sample 190 is 1.

It is apparent from the above comparison results that Sample 193, and Samples 196 to 200, have characteristics superior to other samples. That is, if the samples are satisfied with the following conditions:

i. The piezo-electric device formed with a circular hole in the central portion thereof is oscillated within the rectangular hole, ii. The area of the circular hole is in the range of 10 to 80% of the area of the rectangular hole, and iii. An angle formed between the direction of the maximum breaking strength and the direction of the long diameter of the rectangular hole is within 10 degrees, then the high sensitivity characteristics wherein the output voltage extremely increases have been confirmed to be obtained.

(EFFECTS OF THE INVENTION)

As described above, according to the piezo-electric acceleration sensor of the present invention, the following effects are obtained:

(1) The laminate comprising the oscillation plate and the piezo-electric element is supported in a stretched fashion within the oscillation hole in the fixing portion and the through-hole is formed in the central portion of the laminate. Therefore, the detection sensitivity can be enhanced as compared with those not formed with a through-hole.

(2) By setting the proportion of the size between the oscillation hole and the through-hole and the proportion of the deformation in the oscillation portion, it is possible to overcome the disadvantages encountered in those without a through-hole to obtain stable output characteristics and frequency characteristics.

(3) With respect to the oscillation portion, the conditions of the distance from the inner edge portion of the through-hole to the inner edge portion of the oscillation hole are varied to be equal in various parts in the peripheral direction or varied intentionally, whereby the measuring range of the acceleration sensor can be widened.

(4) In the case where the breaking strength of the piezo-electric devise is applied with the directivity, the direction of the maximum breaking strength is set to coincide with the direction in which the oscillation distance increases, whereby the high sensitivity and high output may be obtained.

What is claimed is:

1. A piezo-electric acceleration sensor, comprising: a piezo-electric polymer membrane element having an element through hole; a diaphragm having a diaphragm through hole and attached to the piezo-electric membrane element so that the diaphragm hole is concentric to the element through hole to form a laminate with a laminate through hole; and fixing means, having a sensing hole, for fixing the laminate in a stretched manner, and wherein: the laminate through hole has about 2.25 to approximately 80% of the area of the sensing hole; and the diaphragm and the piezo-electric element meet the equation:

$$(Eb \times Tb^3)/(Ep \times Tp^3) \geq \text{about } 5$$

where Eb, Tb, Ep and Tp are Young's modulus and thickness of the diaphragm and Young's modulus and thickness of the piezoelectric element, respectively, whereby acceleration, applied to the diaphragm, is detected based on a quantity of electricity generated due to strains in a piezo-electric element.

2. A piezo-electric acceleration sensor as recited in claim 1, wherein: the laminate has a peripheral wall defining the laminate hole; the fixing means has a inner peripheral wall defining the sensing hole; and the distance from the peripheral wall of the laminate hole to the inner peripheral wall of the sensing hole is equal along the peripheral wall of the laminate hole.

3. A piezo-electric acceleration sensor as recited in claim 2, wherein: the laminate has a peripheral wall defining the laminate hole; the fixing means has a inner peripheral wall defining the sensing hole; and the laminate has portions where the distance from the peripheral wall of the laminate hole to the inner peripheral wall of the sensing hole is different along the peripheral wall of the laminate hole.

4. A piezo-electric acceleration sensor as recited in claim 1, wherein the sensing hole has a circular shape and the laminate hole is a circular hole concentric with the sensing hole.

5. A piezo-electric acceleration sensor as recited in claim 4, wherein the laminate hole has a diameter 15 to 70% of the sensing hole.

* * * * *